United States Patent
Wu

(10) Patent No.: US 7,512,013 B2
(45) Date of Patent: Mar. 31, 2009

(54) MEMORY STRUCTURES FOR EXPANDING A SECOND BIT OPERATION WINDOW

(75) Inventor: Chao-I Wu, Zhubei (TW)

(73) Assignee: Macronix International Co., Ltd, Hsinchu (TW)

( * ) Notice: Subject to any disclaimer, the term of this patent is extended or adjusted under 35 U.S.C. 154(b) by 210 days.

(21) Appl. No.: 11/425,523

(22) Filed: Jun. 21, 2006

(65) Prior Publication Data

US 2007/0297243 A1    Dec. 27, 2007

(51) Int. Cl.
G11C 11/03 (2006.01)
(52) U.S. Cl. .................. 365/185.28; 365/185.13; 365/185.24; 365/185.26; 365/185.29
(58) Field of Classification Search .......... 365/185.28, 365/185.29, 185.26, 185.24, 185.13
See application file for complete search history.

(56) References Cited

U.S. PATENT DOCUMENTS

| | | | |
|---|---|---|---|
| 5,315,145 A | 5/1994 | Lukaszek | |
| 5,319,229 A | 6/1994 | Shimoji et al. | |
| 6,011,725 A | 1/2000 | Eitan | |
| 6,172,368 B1 | 1/2001 | Tarr et al. | |
| 6,320,786 B1 | 11/2001 | Chang et al. | |
| 6,324,099 B1 * | 11/2001 | Iijima | 365/185.24 |
| 6,487,114 B2 | 11/2002 | Jong et al. | |
| 6,576,922 B1 | 6/2003 | Ma et al. | |
| 6,768,165 B1 * | 7/2004 | Eitan | 257/324 |
| 7,209,390 B2 * | 4/2007 | Lue et al. | 365/185.19 |
| 7,315,474 B2 | 1/2008 | Lue et al. | |
| 2005/0006696 A1 | 1/2005 | Noguchi et al. | |
| 2007/0029625 A1 * | 2/2007 | Lue et al. | 257/411 |
| 2007/0081387 A1 * | 4/2007 | Lung | 365/185.18 |
| 2007/0267687 A1 | 11/2007 | Lue | |

FOREIGN PATENT DOCUMENTS

JP       11040682       2/1999

OTHER PUBLICATIONS

U.S. Appl. No. 60/805,445, filed Jun. 21, 2006 by inventor Chao-I Wu entitled "*Multi-Level Cell Memory Structures with Enlarged Second Bit Operation Window*".
U.S. Appl. No. 60/805,448, filed Jun. 21, 2006 by inventor Chao-I Wu entitled "*Method and Structure for Operating Memory Devices on Fringes of Control Gate.*"
Lue et al., "BE-SONOS: A Bandgap Engineered SONOS with Excellent Performance and Reliability," IEDM Tech Digest, IEEE Int'l Dec. 2005, 547-550.
Office Action mailed Mar. 5, 2008 from U.S. Appl. No. 11/425,482, filed Jun. 21, 2006, 8 pages.
Office Action mailed Mar. 10, 2008 from U.S. Appl. No. 11/425,541, filed Jun. 21, 2006, 9 pages.
Office Action mailed May 23, 2008 from U.S. Appl. No. 11/425,553, filed Jun. 21, 2006, 9 pages.

* cited by examiner

Primary Examiner—Pho M. Luu
(74) Attorney, Agent, or Firm—Haynes Beffel & Wolfeld LLP

(57) ABSTRACT

A charge trapping memory having a plurality of memory cells in which each memory cell is capable of storing in a left charge storage site and a right charge storage site, multiple bits per memory cell. A memory operation window the memory cell is improved by biasing the memory cell for programming the right charge storage site improved when the left charge storage site stores charge sufficient to establish a negative threshold voltage, or a threshold voltage lower than an initial voltage level.

14 Claims, 32 Drawing Sheets

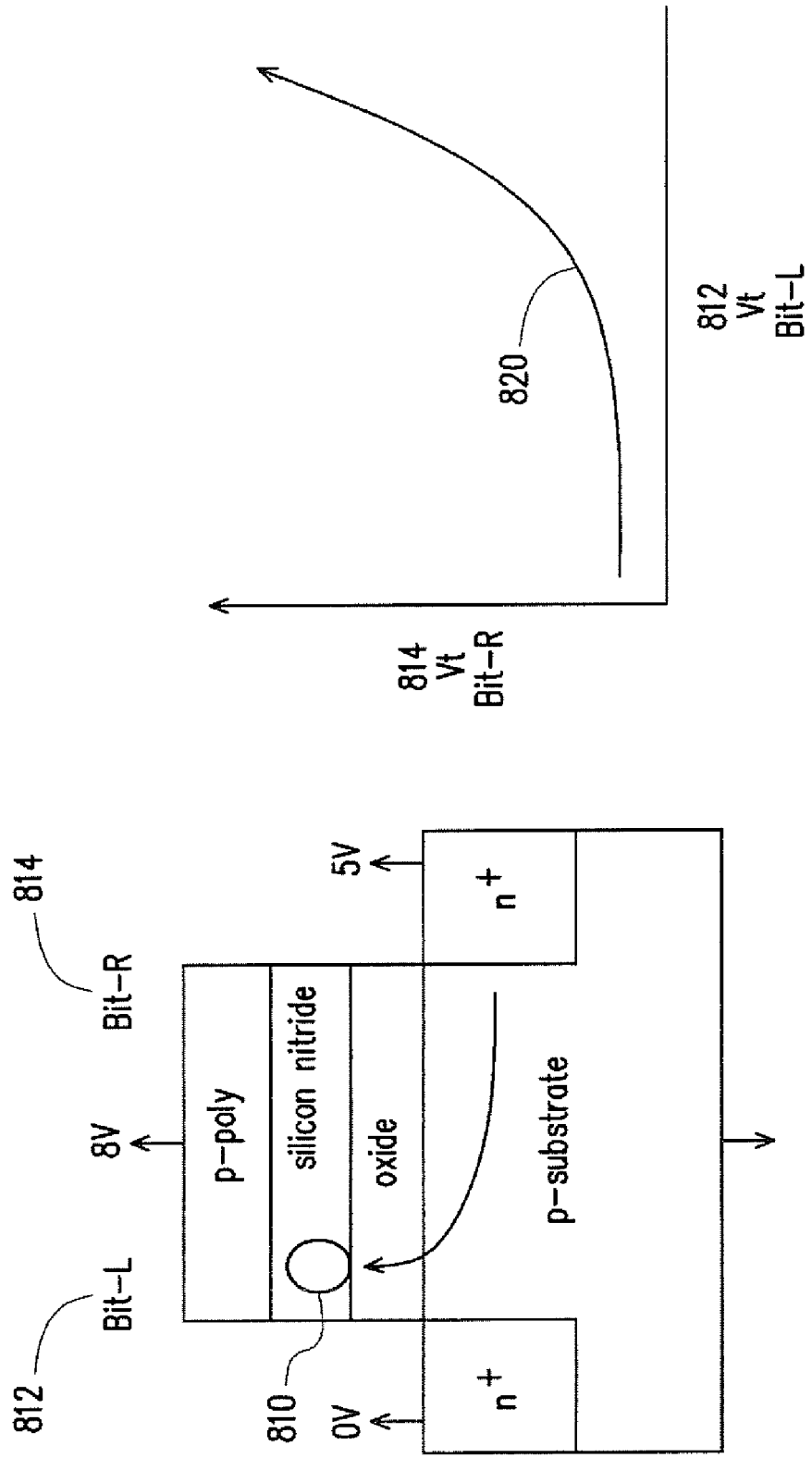

Erase the cell Vt to about 0V

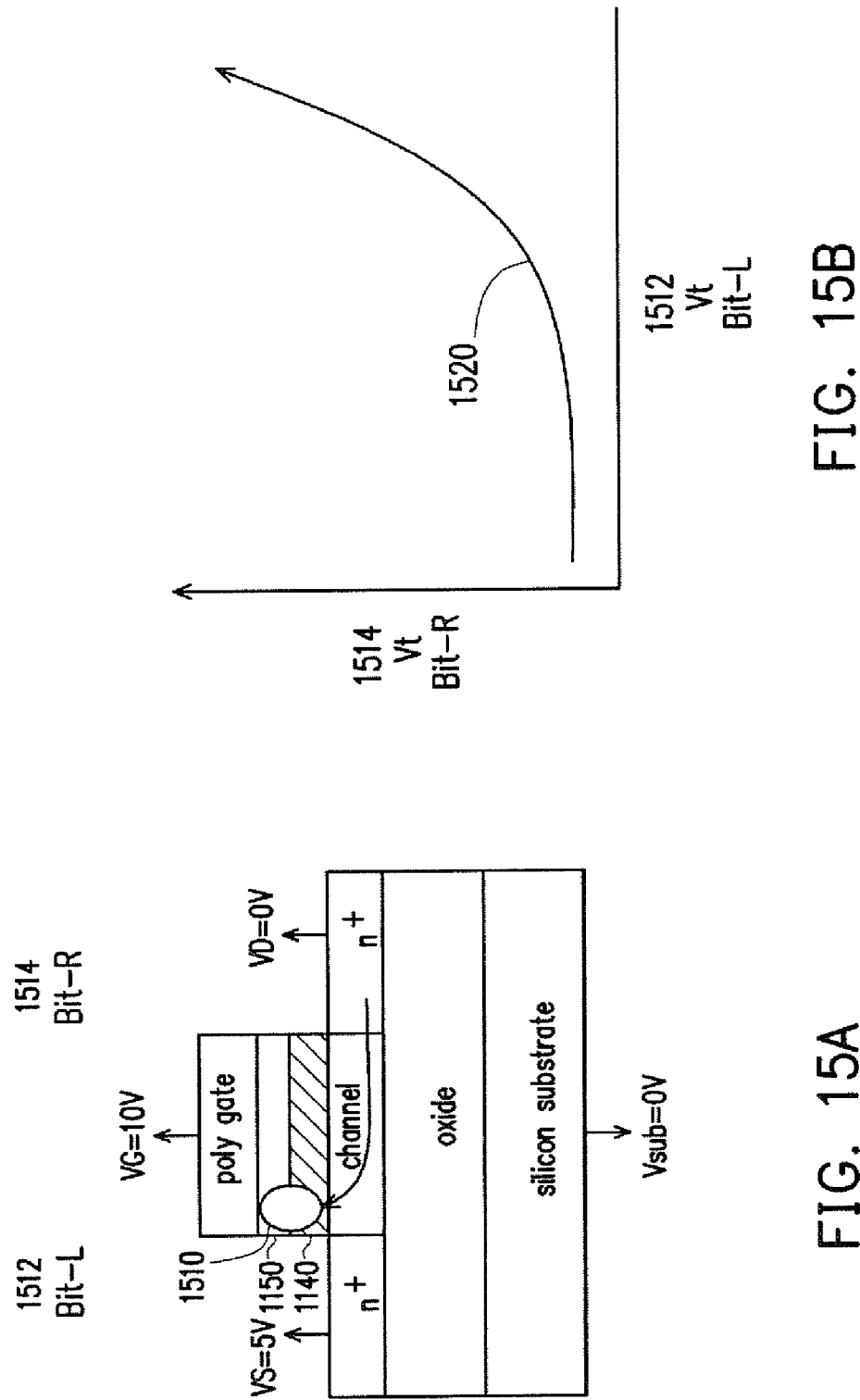

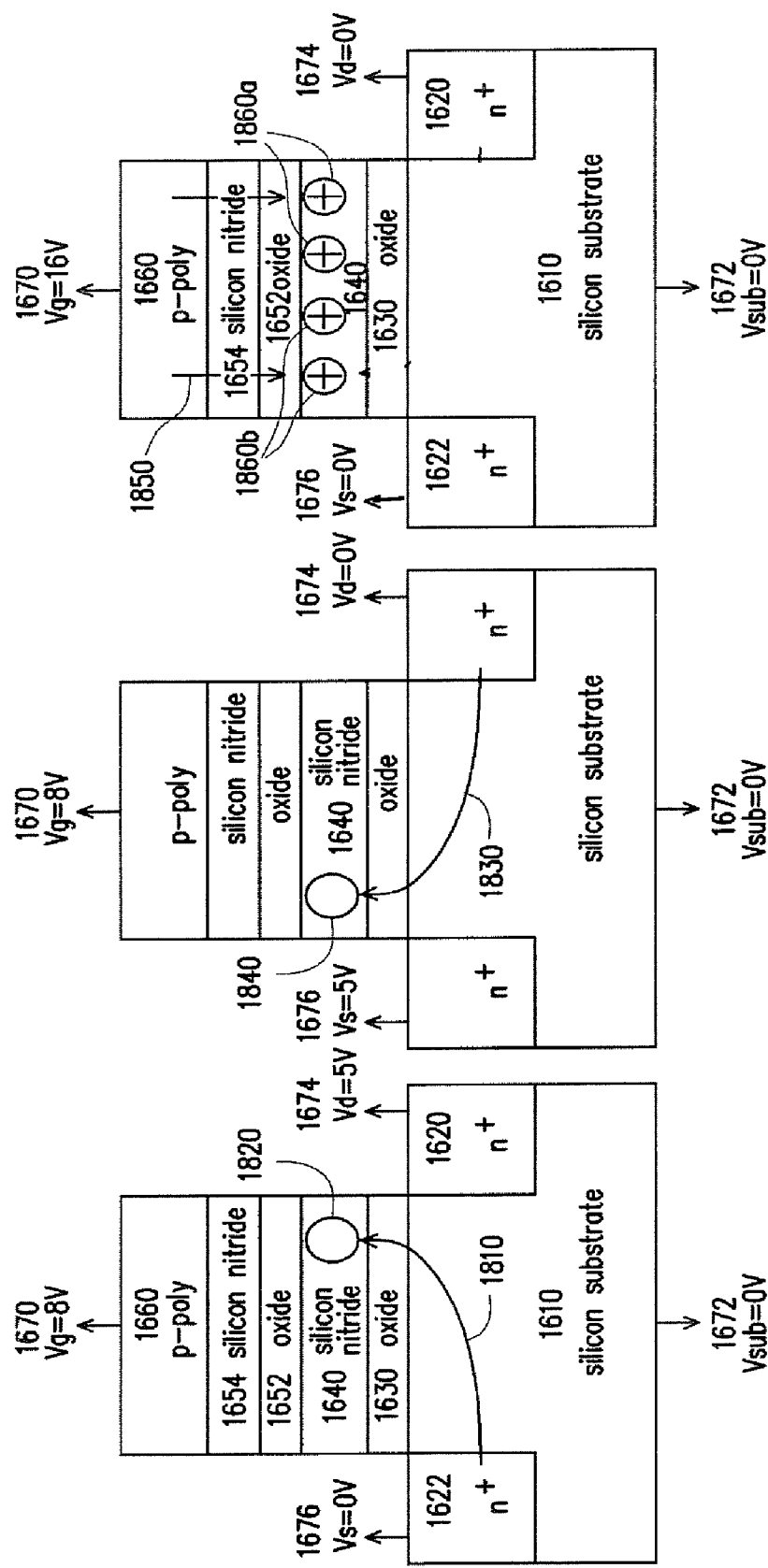

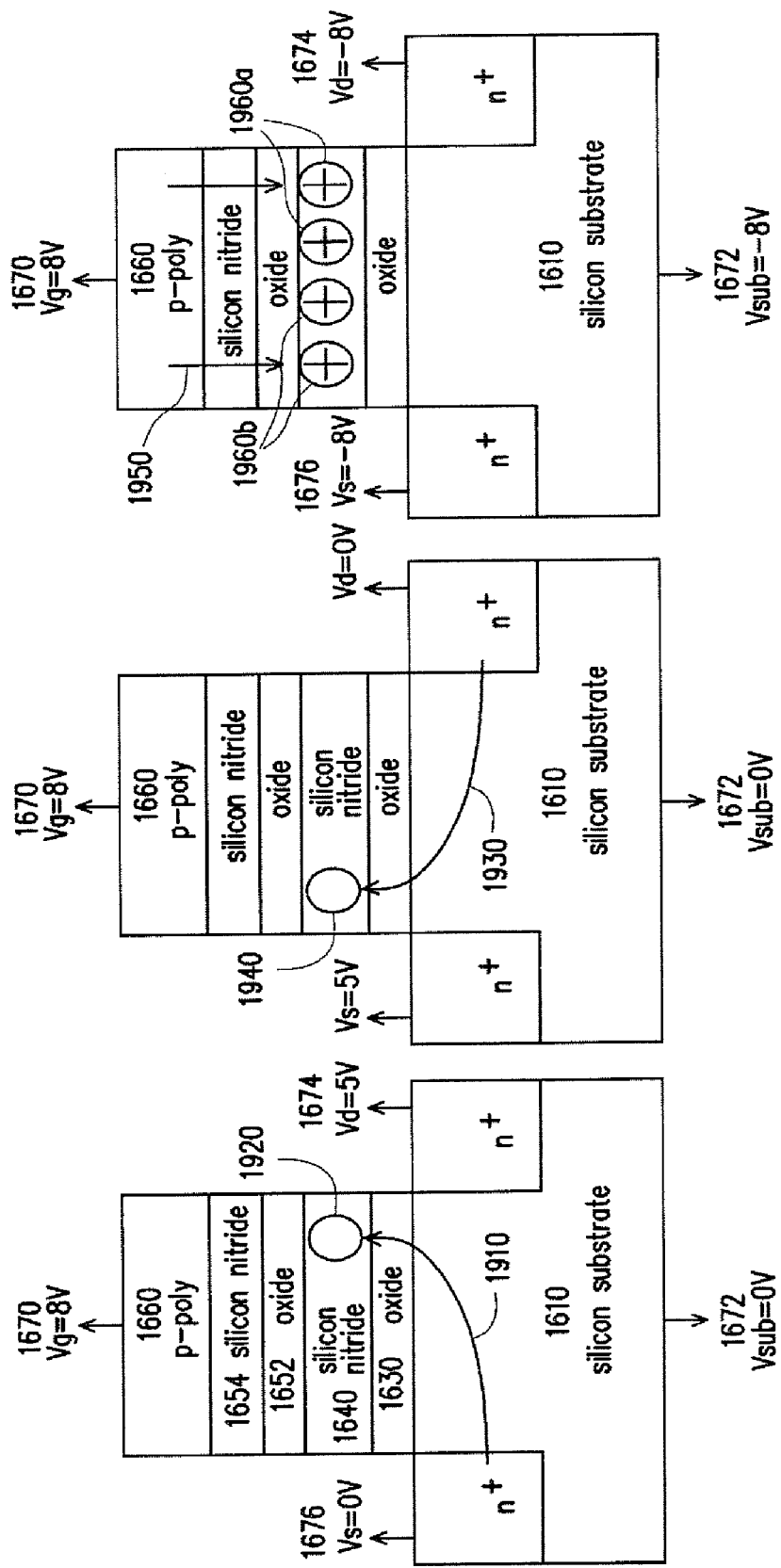

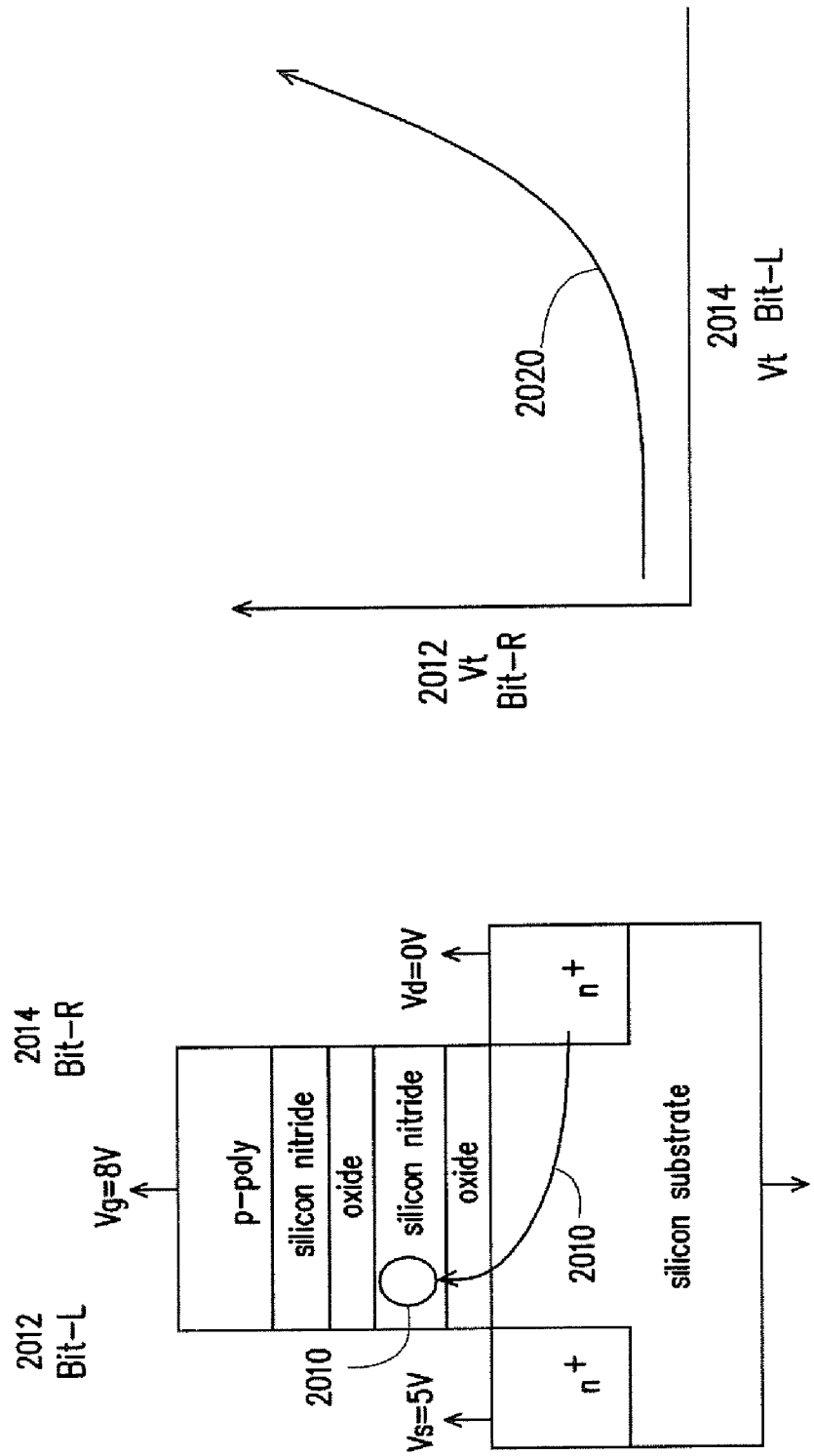

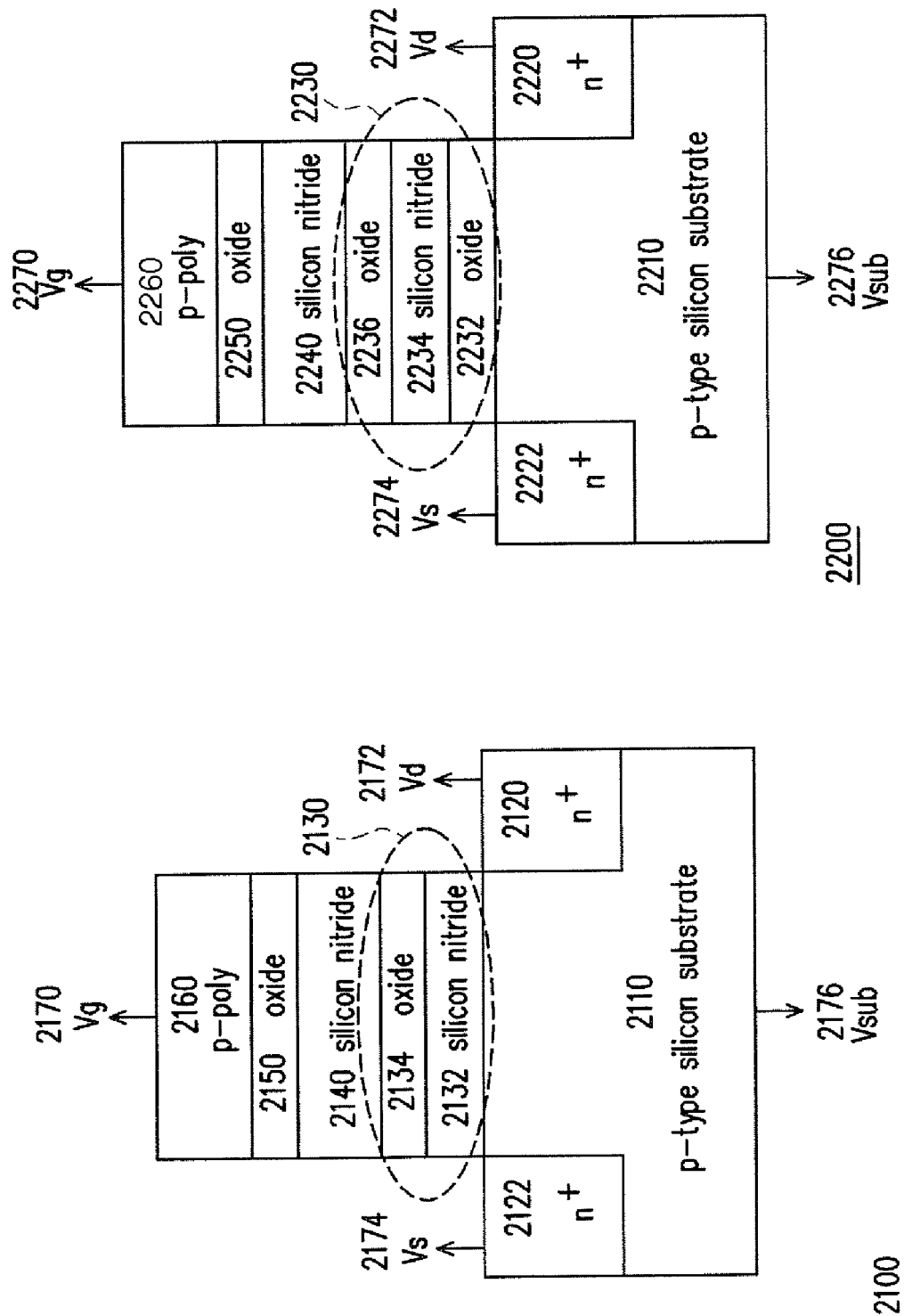

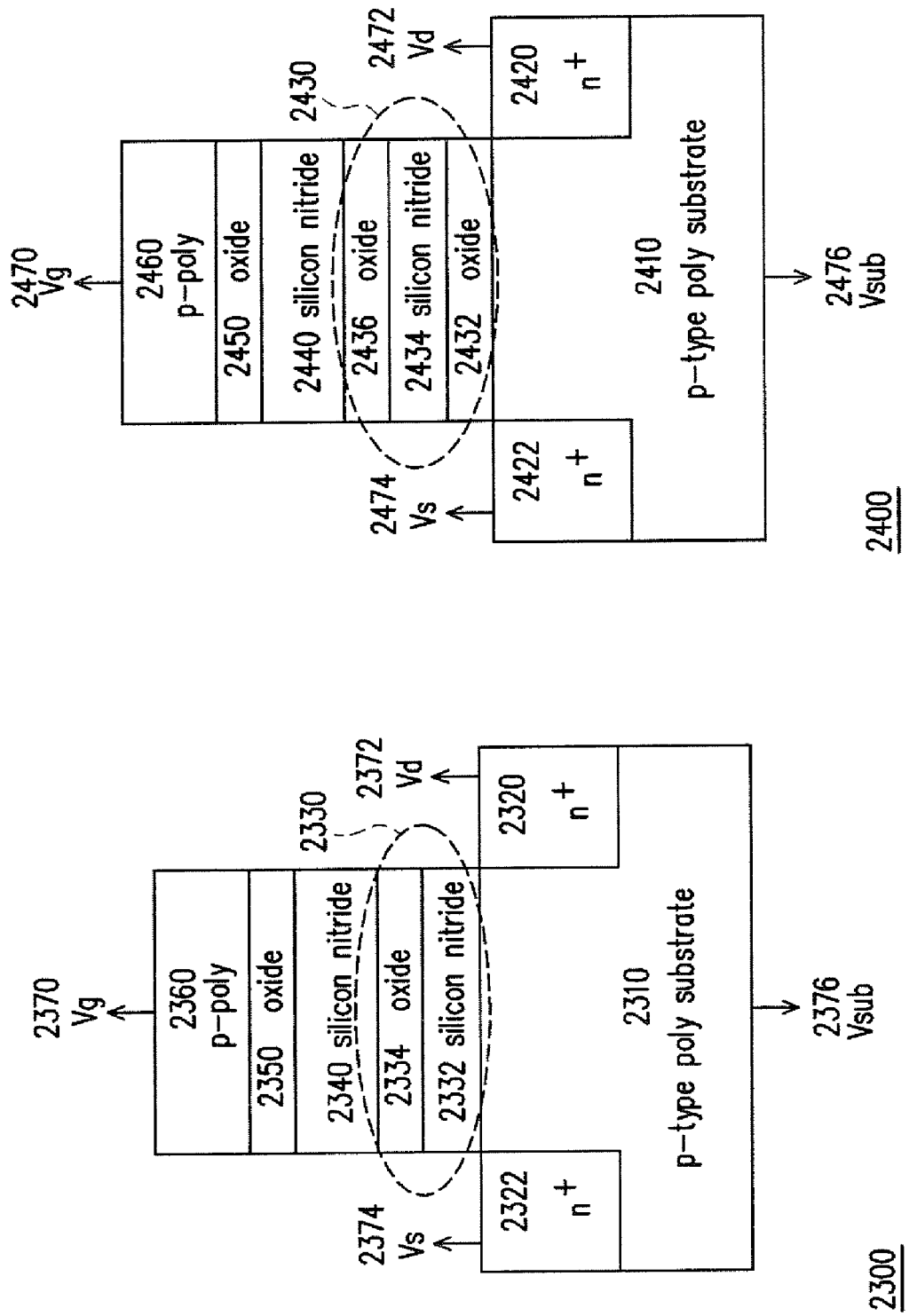

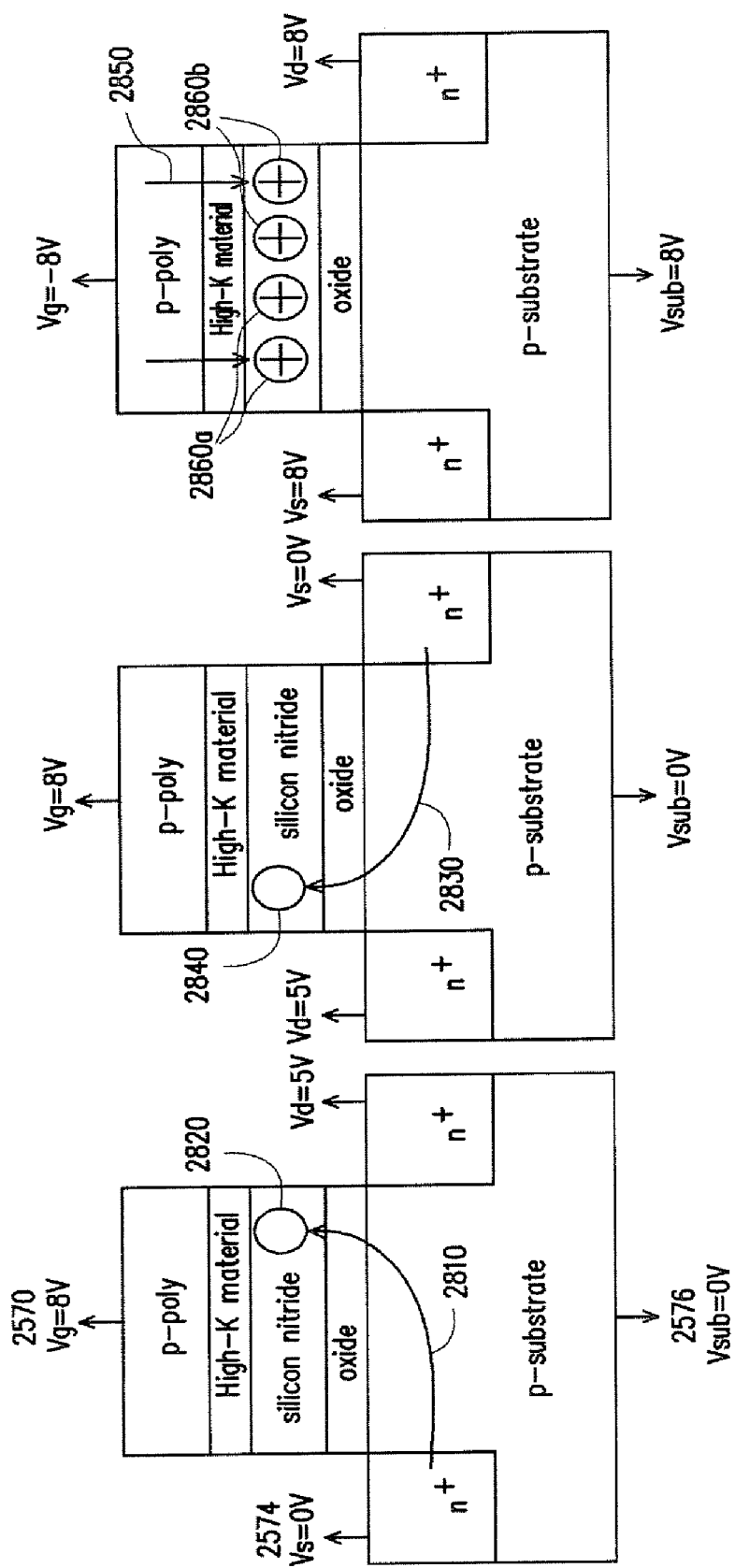

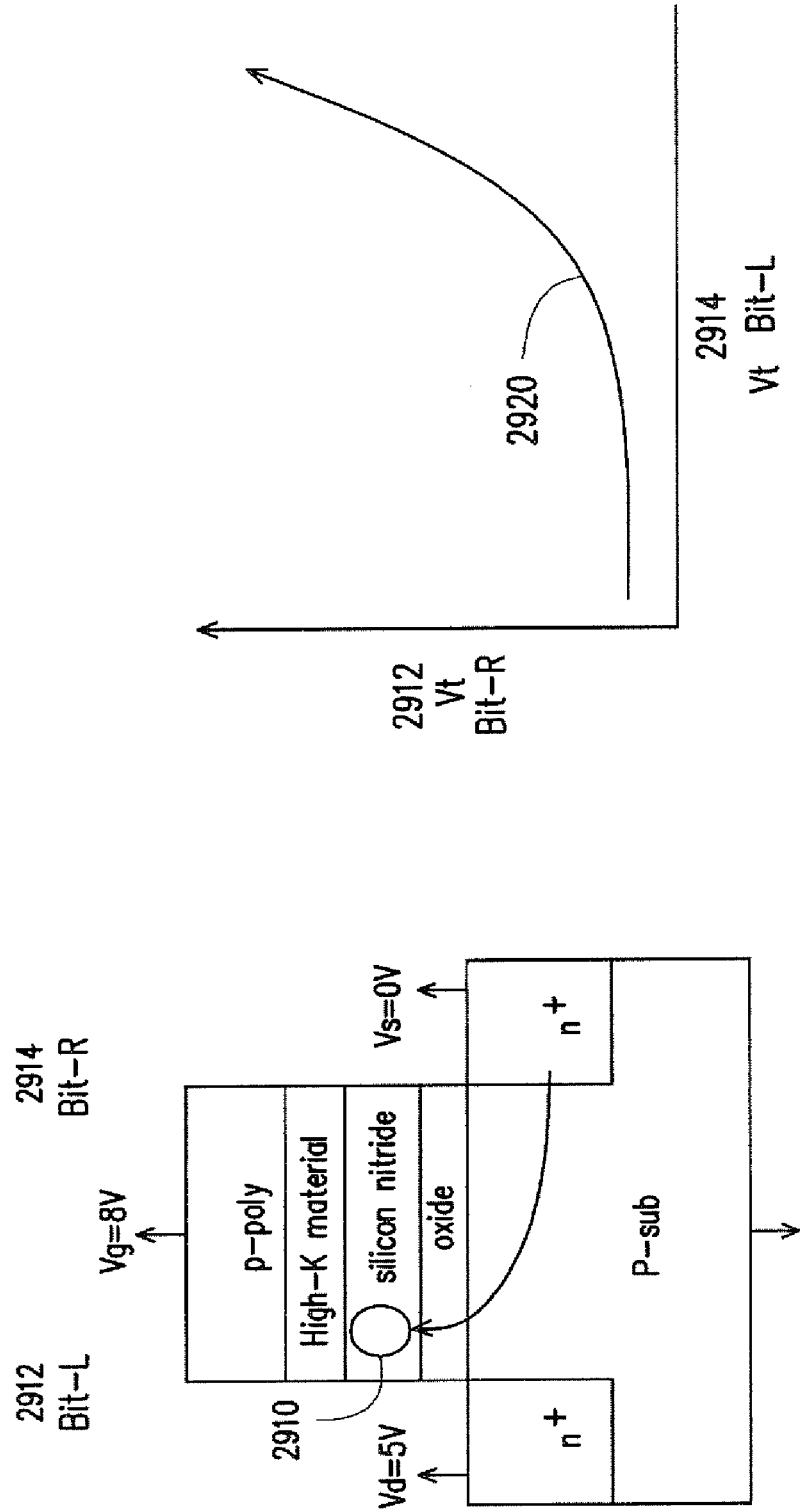

MEMORY STRUCTURES FOR EXPANDING A SECOND BIT OPERATION WINDOW

CROSS REFERENCE TO RELATED APPLICATIONS

This application relates to a concurrently filed and co-pending U.S. patent application Ser. No. 11/425,482, entitled "Methods and Structures for Expanding a Memory Operation Window and Reducing a Second Bit Effect" by Chao-I Wu, owned by the assignee of this application and incorporated herein by reference.

This application relates to a concurrently filed and co-pending U.S. patent application Ser. No. 11/425,541, entitled "Top Dielectric Structures in Memory Devices and Methods for Expanding a Second Bit Operation Window" by Chao-I Wu, owned by the assignee of this application and incorporated herein by reference.

This application relates to a concurrently filed and co-pending U.S. patent application Ser. No. 11/425,553, entitled "Bottom Dielectric Structures and High-K Memory Structures in Memory Devices and Methods for Expanding a Second Bit Operation Window" by Chao-I Wu, owned by the assignee of this application and incorporated herein by reference.

BACKGROUND OF THE INVENTION

1. Field of the Invention

The present invention relates generally to electrically programmable and erasable memory, and more particularly, to methods and devices for increasing a memory operation window and reducing a second bit effect in multi-bit-per-cell operations.

2. Description of Related Art

Electrically programmable and erasable nonvolatile memory technologies based on charge storage structures known as Electrically Erasable Programmable Read-Only Memory (EEPROM) and flash memory are used in a variety of modern applications. A flash memory is designed with an array of memory cells that can be independently programmed and read. Sense amplifiers in a flash memory are used to determine the data value or values stored in a nonvolatile memory. In a typical sensing scheme, an electrical current through the memory cell being sensed is compared to a reference current by a current sense amplifier.

A number of memory cell structures are used for EEPROM and flash memory. As the dimensions of integrated circuits shrink, greater interest is arising for memory cell structures based on charge trapping dielectric layers, because of the scalability and simplicity of the manufacturing processes. Memory cell structures based on charge trapping dielectric layers include structures known by the industry names Nitride Read-Only Memory (NROM), SONOS, and PHINES, for example. These memory cell structures store data by trapping charge in a charge trapping dielectric layer, such as silicon nitride. As negative charge is trapped, the threshold voltage of the memory cell increases. The threshold voltage of the memory cell is reduced by removing negative charge from the charge trapping layer.

NROM devices use a relatively thick bottom oxide, e.g. greater than 3 nanometers, and typically about 5 to 9 nanometers, to prevent charge loss. Instead of direct tunneling, band-to-band tunneling induced hot hole injection BTBTHH can be used to erase the cell. However, the hot hole injection causes oxide damage, leading to charge loss in the high threshold cell and charge gain in the low threshold cell. Moreover, the erase time must be increased gradually during program and erase cycling due to the hard-to-erase accumulation of charge in the charge trapping structure. This accumulation of charge occurs because the hole injection point and electron injection point do not coincide with each other, and some electrons remain after the erase pulse. In addition, during the sector erase of an NROM flash memory device, the erase speed for each cell is different because of process variations (such as channel length variation). This difference in erase speed results in a large Vt distribution of the erase state, where some of the cells become hard to erase and some of them are over-erased. Thus the target threshold Vt window is closed after many program and erase cycles and poor endurance is observed. This phenomenon will become more serious when the technology keeps scaling down.

A traditional floating gate device stores 1 bit of charge in a conductive floating gate. The advent of NROM cells in which each NROM cell provides 2 bits of flash cells that store charge in an Oxide-Nitride-Oxide (ONO) dielectric. In a typical structure of an NROM memory cell, a nitride layer is used as a trapping material positioned between a top oxide layer and a bottom oxide layer. The charge in the ONO dielectric with a nitride layer may be either trapped on the left side, i.e. the left bit, or the right side, i.e. the right bit, of an NROM cell. An operation applied to the left bit affects the right bit, or vice versa, which is known as a second bit effect. The second bit effect impacts an operation window of the NROM cell.

A frequently used technique to program NROM cells in an NROM array is the hot electron injection method. During an erase operation, a common technique used to erase memory cells is called the band-to-band tunneling hot hole injection. The intrinsic issue of second bit effect affects the operation window. The second bit effect is caused by the interaction of a left bit and a right bit in the NROM memory cell. It is desirable to have methods and devices that increase a memory operation window in a charge trapping memory so that the second bit effect is significantly reduced.

SUMMARY OF THE INVENTION

The present invention describes methods for increasing a memory operation window in a charge trapping memory having a plurality of memory cells in which each memory cell is capable of storing multiple bits per memory cell. In a first aspect of the invention, a first method to increase a memory operation window in a two-bit-per-cell memory is described by applying a positive gate voltage, +Vg, to erase a memory cell to a negative voltage level. Alternatively, a negative gate voltage, −Vg, is applied to the two-bit-per-cell memory for erasing the charge trapping memory to a negative voltage level. A second method to increase a memory operation window is achieved by erasing the charge trapping memory to a voltage level that is lower than an initial voltage threshold level, Vt(i). These two methods of erasing a charge trapping memory to either a negative voltage level or to a voltage level that is less than the initial voltage threshold level are also referred to as turn-on mode (TOM) methods. The two erase methods can be implemented either before a programming step (i.e., a pre-program erase operation), or after a programming step (i.e., a post-program erase operation).

Two exemplary erase operations are illustrated in the following three embodiments for implementing the present invention. The two erase operations include a hole injection erase operation and a band-to-band hot hole erase operation. In a first embodiment, the charge trapping memory is erased using a hole injection by a hole tunneling erase with a positive voltage. In a second embodiment, the charge trapping memory is erased using a hole injection by a hole tunneling erase with a negative voltage. In a third embodiment, the charge trapping memory is erased using a band-to-band hot hole operation. A programming technique that is suitable for operation with these erase operations of a charge trapping memory includes a channel hot electron (CHE).

The methods of the present invention are applied to a wide variety of memory devices that have a charge trapping structure, including but not limited to memory devices having a nitride-oxide structure, an oxide-nitride-oxide structure, an nitride-oxide-nitride-oxide structure and an oxide-nitride-oxide-nitride-oxide structure. For example, in an MNOS memory device, a charge trapping layer overlies a dielectric layer without the presence of a dielectric layer that is disposed over the charge trapping layer. Instead, a poly layer is formed over the charge trapping layer. The nitride-oxide structure without a dielectric layer enables holes to be injected readily from the poly layer to the charge trapping layer.

In a second aspect of the invention, a memory device in an MNOS-SOI structure is described to increase a memory operation window while reducing a second bit effect. A channel is formed between a source region and a drain region without the need to apply a gate bias voltage, Vg. The MNOS-SOI memory comprises a charge trapping structure overlying the channel, where the charge trapping structure includes silicon nitride disposed over a dielectric layer. Alternatively, the memory device is implemented in a MONOS-SOI memory comprising a charge trapping structure having an oxide-nitride-oxide stack. A suitable material to manufacture the channel includes an epitaxy silicon or a poly silicon. The erase operation of a hole tunneling erase or a band-to-band hot hole erase can be applied in combination with the channel hot electron techniques.

In a third aspect of the invention, a memory device in an MNONOS structure is described with the application of a turn-on mode method to increase an operation window while reducing a second bit effect. The MNONOS memory structure comprises a top oxide structure having a silicon nitride layer overlying a dielectric layer. Alternatively, the memory device is implemented in a MONONOS structure that has a top oxide structure of an oxide-nitride-oxide stack. The memory device with a top oxide structure can also be implemented on a thin-film transistor (TFT) structure by fabricating the memory device on a poly substrate, rather than a silicon substrate. Therefore, other embodiments of the memory device include MNONOS TFT memory structure and MONONOS TFT memory structure. The erase operation of a hole tunneling erase or a band-to-band hot hole erase can be applied in combination with a channel hot electron technique. The turn-on mode operation can utilize both a high voltage memory operation and a low voltage memory operation. In the low voltage memory operation, a voltage of less than about plus or minus +/−8 volts can be selected to carry out the erase operation.

In a fourth aspect of the invention, a charge trapping memory in a MONONS structure is described with the application of the turn-on mode method to increase an operation window and reducing a second bit effect. The MONONS memory structure comprises a bottom oxide structure having a dielectric layer overlying a silicon nitride layer. Alternatively, the memory device is implemented in a MONONOS structure comprising a bottom oxide structure having an oxide-nitride-oxide stack. The memory device with a bottom oxide structure can also be implemented on a thin-film transistor (TFT) structure by fabricating the memory device on a poly substrate, rather than a silicon substrate. Therefore, other embodiments of the memory device include MONONS TFT memory structure and MONONOS TFT memory structure. In a further embodiment, the charge trapping memory comprising a high-K material overlying a charge trapping layer on a silicon substrate, M(HK)NOS structure, or on a poly substrate, M(HK)NOS TFT structure. The erase operation of a hole tunneling erase or a band-to-band hot hole erase can be applied in combination with the channel hot electron technique. The turn-on mode operation can utilize both a high voltage memory operation and a low voltage memory operation. In the low voltage memory operation, a voltage of less than about plus or minus +/−8 volts can be selected to carry out the erase operation.

Advantageously, the present invention provides methods and structures for increasing a memory operation window in a charge trapping memory and reducing the second bit effect. The present invention is also applicable to low voltage memory applications.

The structures and methods of the present invention are disclosed in the detailed description below. This summary does not purport to define the invention. The invention is defined by the claims. These and other embodiments, features, aspects, and advantages of the invention will become better understood with reference to the following description, claims and accompanying drawings.

BRIEF DESCRIPTION OF THE DRAWINGS

The invention will be described with respect to specific embodiments thereof and reference will be made to the drawings, in which:

FIG. 8A is a structural diagram illustrating the programming of the left bit in a MNOS structure in accordance with the present invention; and FIG. 8B is a corresponding graphical diagram illustrating the second bit effect, which in this instance refers to the right bit in accordance with the present invention.

FIG. 15A is a structural diagram illustrating the programming of the left bit in the MNOS-SOI structure in accordance with the present invention; and FIG. 15B is a corresponding graphical diagram illustrating the second bit effect of the right bit in accordance with the present invention.

FIGS. 18A-18C are structural diagrams illustrating a first method for increasing a second bit window in a top multi-layer dielectric structure for use in the turn-on mode operation, which are applicable to both the first and second embodiments of the MNONOS memory and the MNONONOS memory, in accordance with the present invention.

FIGS. 19A-19C are structural diagrams illustrating a second method for increasing a second bit window in the top multi-layer dielectric structure for use in the turn-on mode operation, which are applicable to both the first and second embodiments of the MNONOS memory and the MNONONOS memory, in accordance with the present invention.

FIG. 20A is a structural diagram illustrating the programming of the left bit in the MNONOS memory or the MNONONOS memory in accordance with the present invention; and FIG. 20B is a corresponding graphical diagram illustrating the second bit effect of the right bit in accordance with the present invention.

FIG. 21 illustrates a first embodiment of a bottom oxide with a multi-layer dielectric structure implemented in a MONONS memory for use in a turn-on mode operation in accordance with the present invention.

FIG. 22 illustrates a second embodiment of the bottom oxide with the multi-layer dielectric structure implemented in a MONONOS memory for use in the turn-on mode operation in accordance with the present invention.

FIG. 23 illustrates a third embodiment of the bottom oxide with the multi-layer dielectric structure implemented in a MONONS TFT memory on a poly substrate for use in the turn-on mode operation in accordance with the present invention.

FIG. 24 illustrates a fourth embodiment of the bottom oxide with the multi-layer dielectric structure implemented in a MONONOS TFT memory on a poly substrate for use in the turn-on mode operation in accordance with the present invention.

FIGS. 28A-28C are structural diagrams illustrating a second method for increasing a second bit window of a M(HK)NOS memory structure with a high-K material stack on either a silicon substrate or a poly substrate for use in a turn-on mode operation in accordance with the present invention.

FIG. 29A is a structural diagram illustrating the programming of the left bit in the M(HK)NOS memory or the M(HK)NOS TFT memory in accordance with the present invention; and FIG. 29B is a corresponding graphical diagram illustrating the second bit effect of the right bit in accordance with the present invention.

DETAILED DESCRIPTION

Figure 1B:
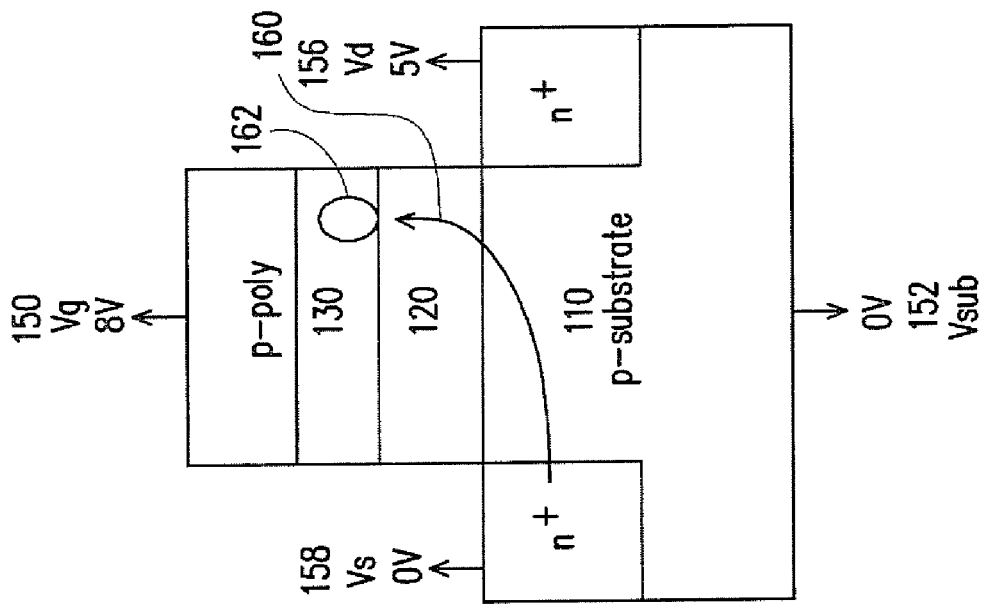
FIG. 1B is a structural diagram illustrating the programming of the charge trapping memory cell by channel hot electron programming of a right bit in accordance with the present invention.

A description of structural embodiments and methods of the present invention is provided with reference to FIGS. 1-34. It is to be understood that there is no intention to limit the invention to the specifically disclosed embodiments but that the invention may be practiced using other features, elements, methods and embodiments. Like elements in various embodiments are commonly referred to with like reference numerals.

Figure 1A:
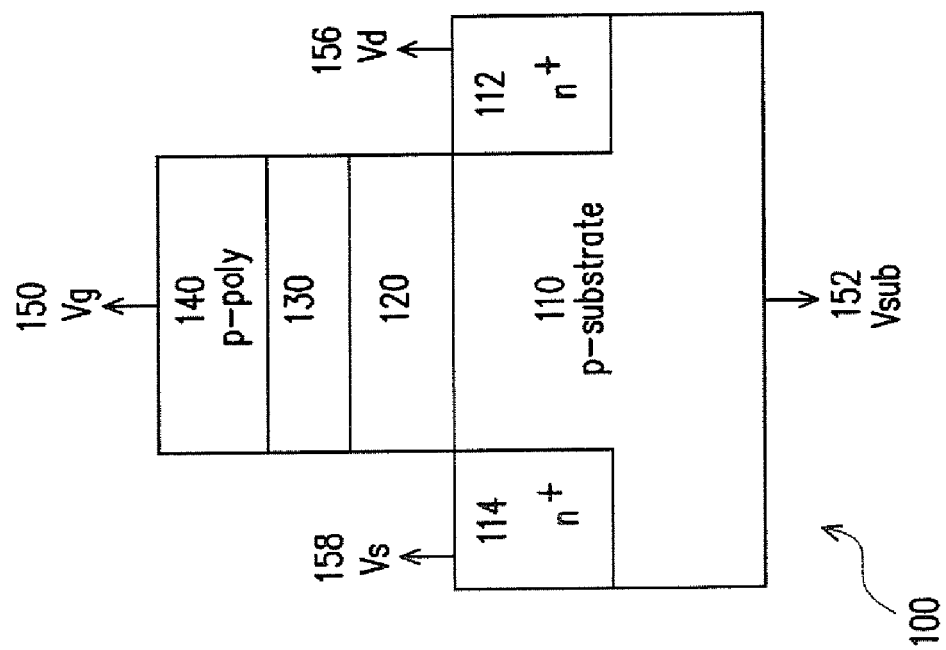
FIG. 1A illustrates a simplified structural diagram of an exemplary charge trapping memory cell in an MNOS structure in accordance with the present invention.

In a first aspect of the invention, referring now to FIG. 1A, there is shown a simplified structural diagram illustrating an exemplary charge trapping memory cell 100 in an MNOS structure. The charge trapping memory cell 100 has a p-type substrate 110 with n+ doped regions 112 and 114. A bottom dielectric structure 120 (bottom oxide) overlays the substrate 110, a charge trapping structure 130 (e.g., a silicon nitride layer) overlays the bottom dielectric structure 120, and a p-poly 140 overlays the charge trapping structure 130. A gate voltage 150, Vg, is applied to the p-poly 140, and a substrate voltage 152, Vsub, is applied to the p-substrate 110. A drain voltage Vd 158 is applied to the n+ doped region 114, and a source voltage Vs 158 is applied to the n+ doped region 112.

The MNOS structure in the charge trapping memory cell 100 is intended as an illustration for implementing the present method invention. The MNOS structure has a nitride-oxide stack without a top oxide, which advantageously allows holes to enter directly into the charge trapping structure 130 without the presence of a top oxide. Other combinations of charge trapping structures, such as oxide-nitride-oxide (ONO), or oxide-nitride-oxide-nitride-oxide (ONONO) stack can be implemented without departing from the spirit of the present invention. The p-poly 140 can be implemented with a wide variety of materials including poly or metal.

FIG. 1B illustrates a structural diagram of the programming of the charge trapping memory cell 100 by channel hot electron at a right bit 162. A directional arrow 160 indicates that the channel hot electron is applied to the right bit 162, as shown with electrons in the charge trapping structure 130. The gate voltage Vg 150 of 8 volts is applied, the drain voltage Vd 156 of 5 volts is applied, the source voltage Vs 158 of 0 volts is applied, and the substrate voltage Vsub 152 of 0 volts is applied. The combination of these applied voltages results in channel hot electron of the right bit in the charge trapping memory 100 to a high positive voltage threshold +Vt.

The bias condition for the drain and source regions 112, 114 is switched to carry out the programming of the other bit in the charge trapping memory 100. FIG. 1C is a structural diagram illustrating the programming of the charge trapping memory 100 by channel hot electron of a left bit. A directional arrow 170 indicates that the channel hot electron is applied to a left bit, as shown with electrons 172 in the charge trapping structure 130. The gate voltage Vg 150 of 8 volts is applied, the drain voltage Vd 156 of 0 volts is applied, the source voltage Vs 158 of 5 volts is applied, and the substrate voltage Vsub 152 of 0 volts is applied. The combination of these applied voltages results in channel hot electron of the left bit of the charge trapping memory cell 100 to a high positive voltage threshold +Vt.

Figure 1D:
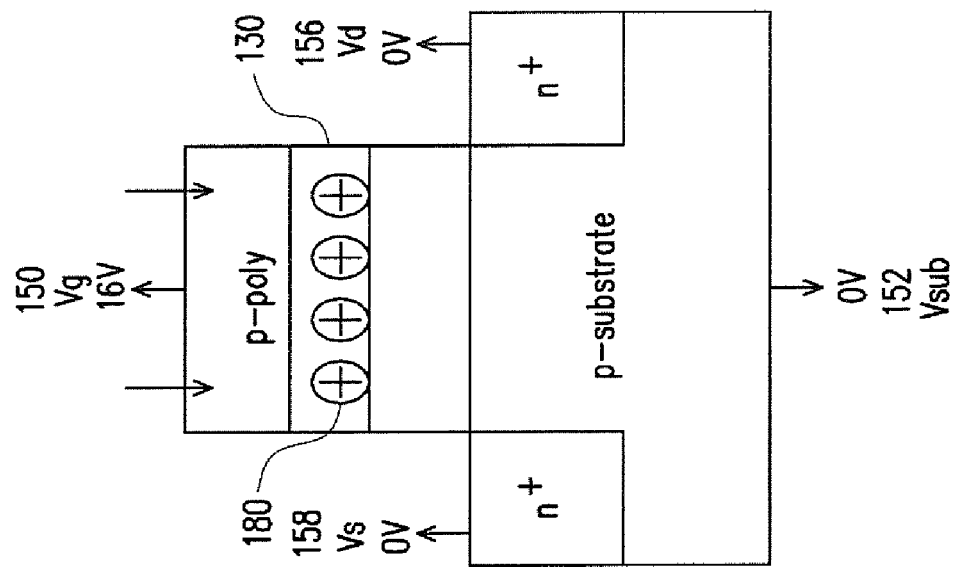
FIG. 1D is a structural diagram illustrating a hole injection erase at a channel region of the charge trapping memory in accordance with the present invention.
Figure 1C:
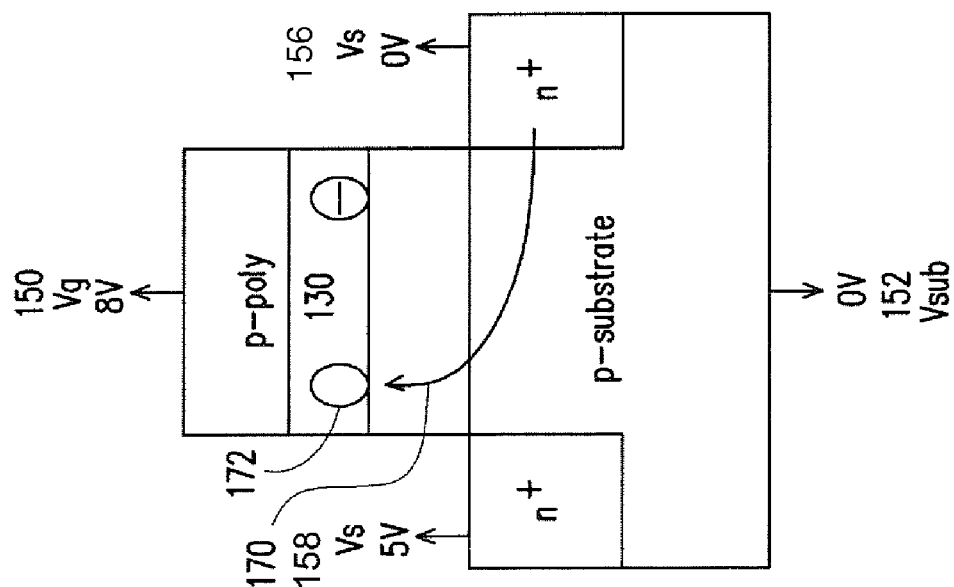
FIG. 1C is a structural diagram illustrating the programming of the charge trapping memory cell by channel hot electron programming of a left bit in accordance with the present invention.

FIG. 1D is a structural diagram illustrating a hole injection (HI) erase at a channel region of the charge trapping memory cell 100. The term "hole injection" is also referred to as "hole tunneling." A hole injection erase is typically not a conventional erase method. When applying a positive gate voltage in hole injection, holes 180 can be injected from the gate to the charge trapping structure 130. The gate voltage Vg 150 of 16 volts is applied, the drain voltage Vd 156 of 0 volts is applied, the source voltage Vs 158 of 0 volts is applied, and the substrate voltage Vsub 152 of 0 volts is applied. The combination of these applied voltages results in the left bit and the right bit of the charge trapping memory cell 100 to a negative voltage threshold −Vt.

As generally used herein, programming refers to raising the threshold voltage of a memory cell and erasing refers to lowering the threshold voltage of a memory cell. However, the invention encompasses both products and methods where programming refers to raising the threshold voltage of a memory cell and erasing refers to lowering the threshold voltage of a memory cell, and products and methods where programming refers to lowering the threshold voltage of a memory cell and erase refers to raising the threshold voltage of a memory cell.

Representative top dielectrics include silicon dioxide and silicon oxynitride having a thickness of about 5 to 10 nanometers, or other similar high dielectric constant materials including for example $Al_2O_3$. Representative bottom dielectrics include silicon dioxide and silicon oxynitride having a thickness of about 3 to 10 nanometers, or other similar high dielectric constant materials. Representative charge trapping structures include silicon nitride having a thickness of about 3 to 9 nanometers, or other similar high dielectric constant materials, including metal oxides such as $Al_2O_3$, $HfO_2$, $CeO_2$, and others. The charge trapping structure may be a discontinuous set of pockets or particles of charge trapping material, or a continuous layer as shown in the drawing. The charge trapping structure 130 has trapped charge such as represented by electrons.

Figure 2:
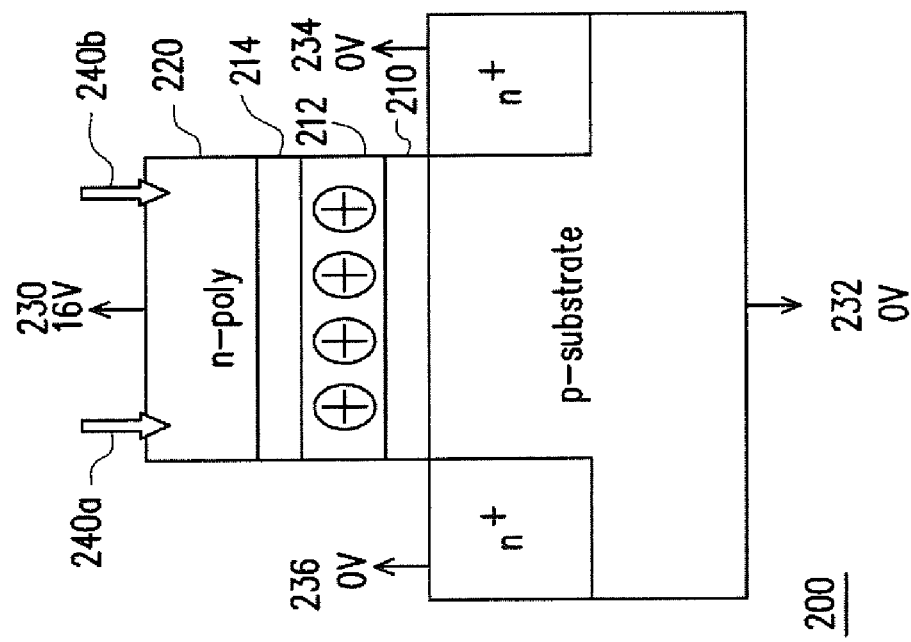
FIG. 2 is a structural diagram illustrating a first embodiment of an erase method by employing a hole tunneling erase with a positive gate voltage to a negative voltage threshold from a gate terminal in a SONOS memory in accordance with the present invention.

Turning now to FIG. 2, there is shown a structural diagram illustrating a first embodiment of an erase method by employing a hole tunneling erase of the SONOS memory 200 to a negative voltage threshold by applying a positive gate voltage from a gate terminal of the SONOS memory 200. The SONOS memory 200 comprises a charge trapping structure 212 overlaying a first dielectric layer 210, and a second dielectric layer 214 overlaying the charge trapping structure 212. An n-poly layer 220 overlies the second dielectric layer 214. A high bias voltage applied at a gate terminal causes a band distortion so that the second dielectric layer 214 may be thinner at certain regions to allow holes to penetrate through the second dielectric layer 214. When a high bias voltage is applied to a gate terminal in the n-poly 220, holes are injected from the gate terminal (as indicated by arrows 240a, 240b), through the second dielectric layer 214, and to the charge trapping structure 212. The second dielectric layer 214 may be selected to be sufficiently thin for hole tunneling through the second dielectric layer 214. A gate voltage Vg 230 is applied with a positive voltage of 16 volts, a drain voltage Vd 234 is applied with 0 volts, a source voltage Vs 236 is applied with 0 volts, and a substrate voltage Vsub 232 is applied with 0 volts. The combination of these applied voltages results in hole tunneling erase of the SONOS memory 200 to the negative voltage threshold −Vt, thereby increasing a memory operational window and reducing the second bit effect.

Figure 3:
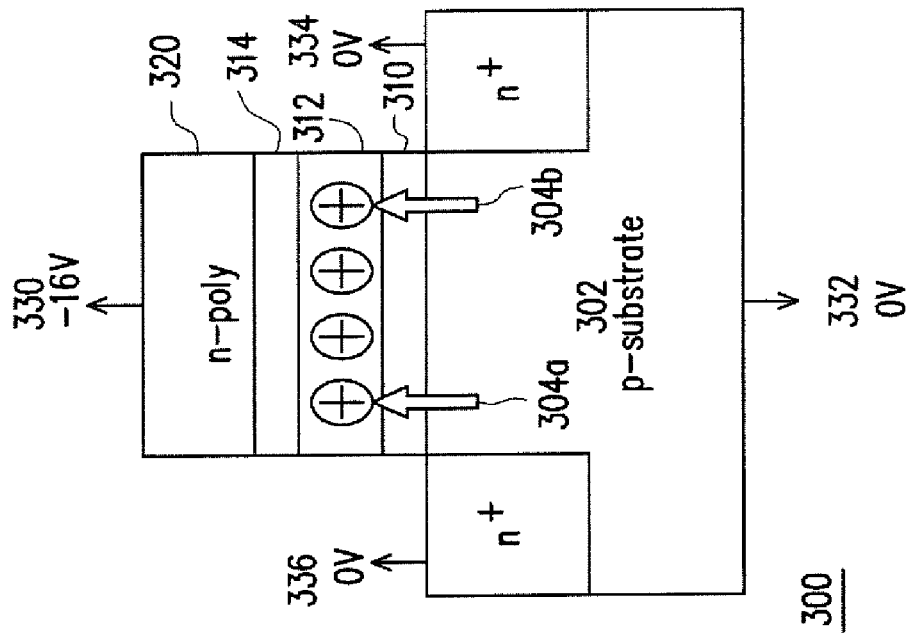
FIG. 3 is a structural diagram illustrating a second embodiment of the erase method by employing a hole tunneling erase with a negative gate voltage to a negative voltage threshold from a substrate in a SONOS memory in accordance with the present invention.

In FIG. 3, there is shown a structural diagram illustrating a second embodiment of the erase method by applying a hole tunneling erase to a SONOS memory cell 300 to bring the memory cell to a negative voltage threshold by applying a negative gate voltage from a substrate of a SONOS memory cell 300. The SONOS memory cell 300 comprises a charge trapping structure 312 overlaying a first dielectric layer 310, and a second dielectric layer 314 overlaying the charge trapping structure 312. An n-poly layer 320 overlies the second dielectric layer 314. A high negative bias voltage applied at a substrate 302 causes a band distortion so that the first dielectric layer 310 may be thinner at certain regions to allow holes to penetrate through first dielectric layer 310. When a high negative bias voltage is applied to the substrate 302, holes are injected from the substrate 302 (as indicated by arrows 340a, 340b), through the first dielectric layer 310, and to the charge trapping structure 312. The first dielectric layer 310 may be selected to be sufficiently thin for hole tunneling through the first dielectric layer 310. A gate voltage Vg 330 is applied with a negative voltage of −16 volts, a drain voltage Vd 334 is applied with 0 volts, a source voltage Vs 336 is applied with 0 volts, and a substrate voltage Vsub 332 is applied with 0 volts. The combination of these applied voltages results in hole tunneling erase of the SONOS memory 200 to a negative voltage threshold −Vt, thereby increasing a memory operational window and reducing the second bit effect.

Figure 4A:
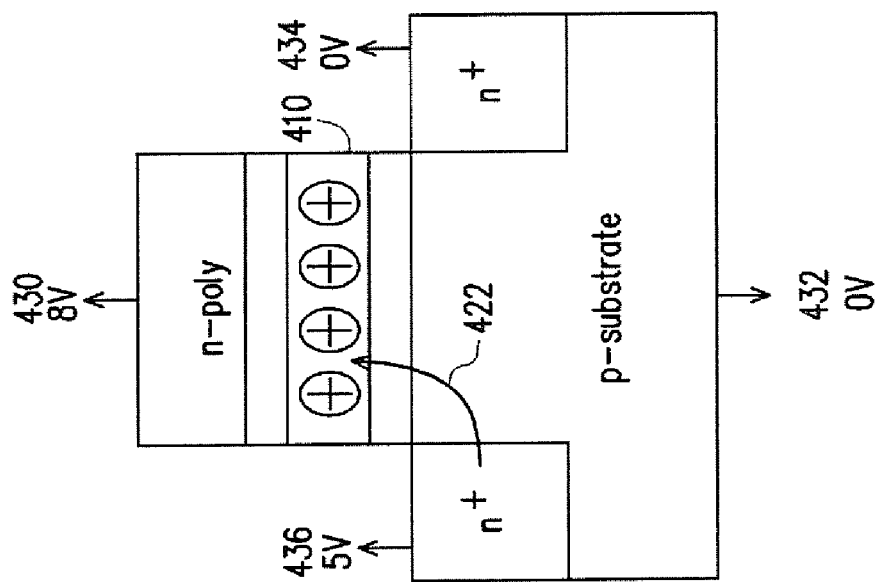
FIGS. 4A-4B are structural diagrams illustrating a third embodiment of the erase method by employing a band-to-band hot hole erase of the SONOS memory to a negative voltage threshold in accordance with the present invention.
Figure 4B:
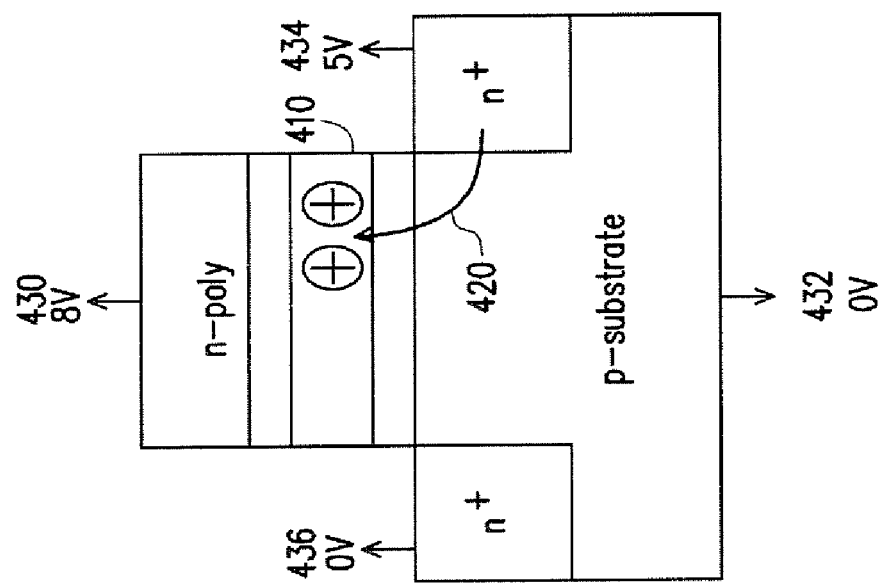

FIGS. 4A-4B are structural diagrams illustrating a third embodiment of the erase method by employing a band-to-band hot hole erase to a negative voltage threshold in the SONOS memory cell 300. The erase operation of a right bit in the SONOS memory cell 300 is illustrated in FIG. 4A and the erase operation of a left bit in the SONOS memory cell 300 is illustrated in FIG. 4B. When erasing a right bit using a band-to-band hot hole erase, a drain voltage Vd 434 is applied with 5 volts and a source voltage Vs 436 is applied with 0 volts in order to move holes toward the right side of a charge trapping structure 410, as indicated by an arrow 420. The bias voltage conditions are reversed in erasing a left bit. When erasing a left bit using a band-to-band hot hole erase, the source voltage Vs 436 is applied with 5 volts and the drain voltage Vd 434 is applied with 0 volts, as indicated by an arrow 422. In both erase operations of the right bit and the left bit, a gate voltage Vg 430 is applied with 8 volts and a substrate voltage Vs 432 is applied with 0 volts.

Alternatively, the erase methods in the first, second and third embodiments are carried out to erase the SONOS memory to a voltage level that is lower than an initial voltage threshold, Vt(i), rather than to a negative voltage threshold Vt. Although the SONOS memory cell is illustrated above with respect to the first, second and third embodiments, other types of charge trapping memories are also applicable to the present invention, including other SONOS-type or TFT-SONOS memories.

Figure 5:
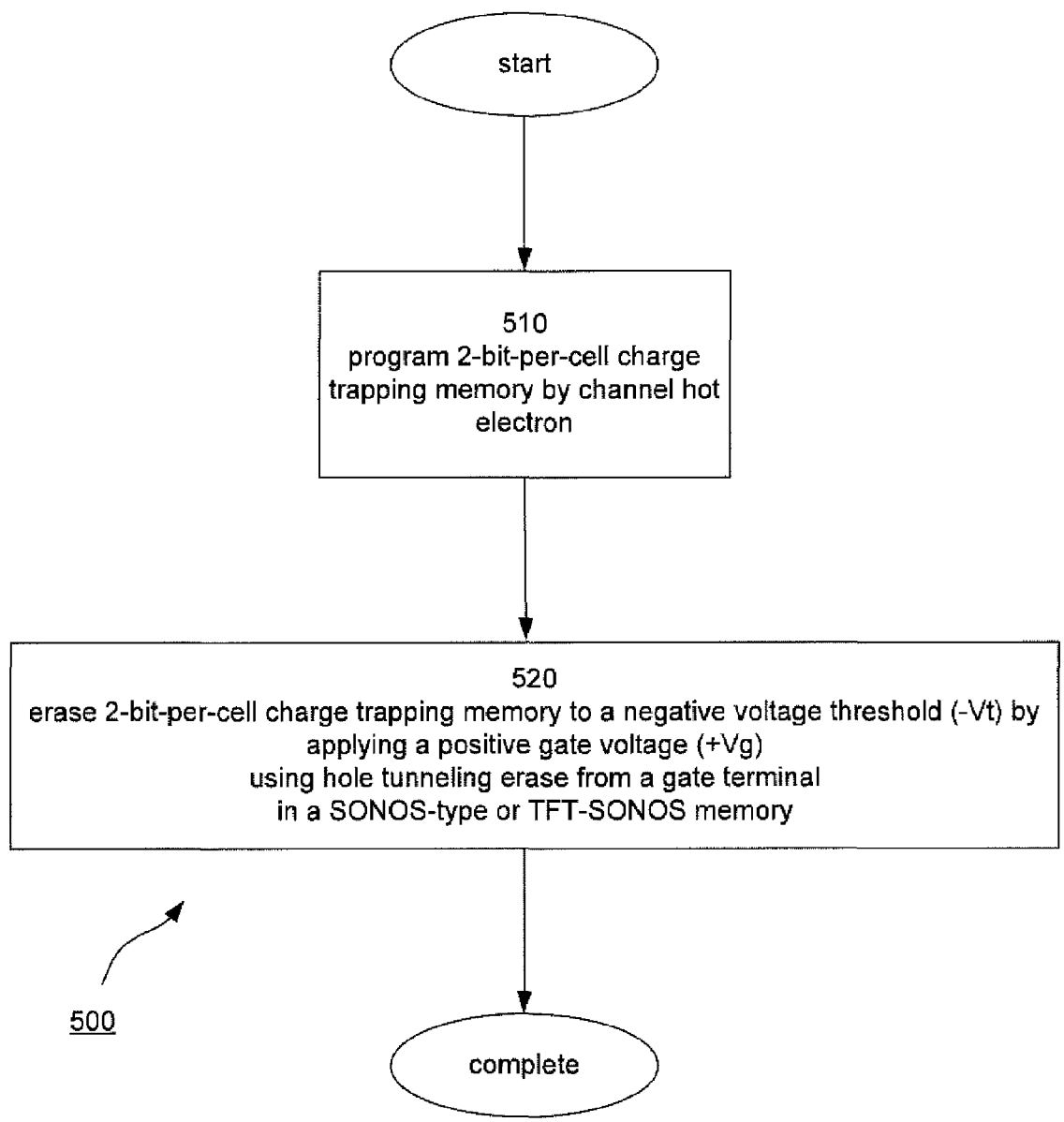
FIG. 5 is a flow diagram illustrating the process in the first embodiment of the erase method by hole tunneling with a positive gate voltage in accordance with the present invention.

As shown in FIG. 5, there is a flow diagram illustrating the process 500 in the first embodiment of the erase method by hole tunneling with a positive gate voltage. At a step 510, the SONOS memory cell 300 is programmed by using a channel hot electron technique. At step 520, the SONOS memory cell 300 is erased to a negative voltage threshold by applying a positive gate voltage which causes hole tunneling erase from the gate terminal. The erase of the SONOS memory cell 300 to a negative voltage threshold increases a memory operation window and reduces the second bit effect. Alternatively, the SONOS memory cell 300 is erased to a voltage level lower than an initial voltage threshold by applying a positive gate voltage from the gate terminal.

Figure 6:
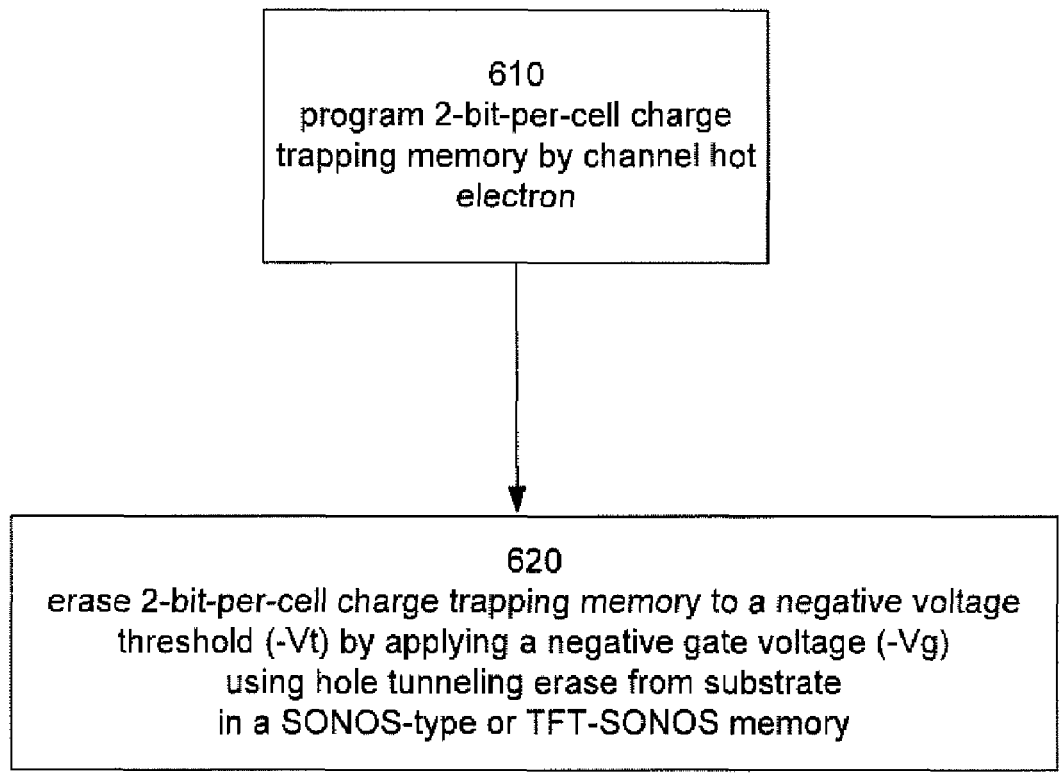
FIG. 6 is a flow diagram illustrating the process in the second embodiment of the erase method by hole tunneling with a negative gate voltage in accordance with the present invention.

In FIG. 6, there is shown a flow diagram illustrating the process 600 in the second embodiment of the erase method by hole tunneling with a negative gate voltage. At a step 610, the SONOS memory cell 300 is programmed by using a channel hot electron technique. At step 620, the SONOS memory cell 300 is erased to a negative voltage threshold by applying a negative gate voltage which causes hole tunneling erase from the substrate. The erase of the SONOS memory cell 300 to a negative voltage threshold increases a memory operation window while reducing the second bit effect. Alternatively, the SONOS memory cell 300 is erased to a voltage level lower than an initial voltage threshold by applying a negative gate voltage from the substrate of the SONOS memory cell 300.

Figure 7:
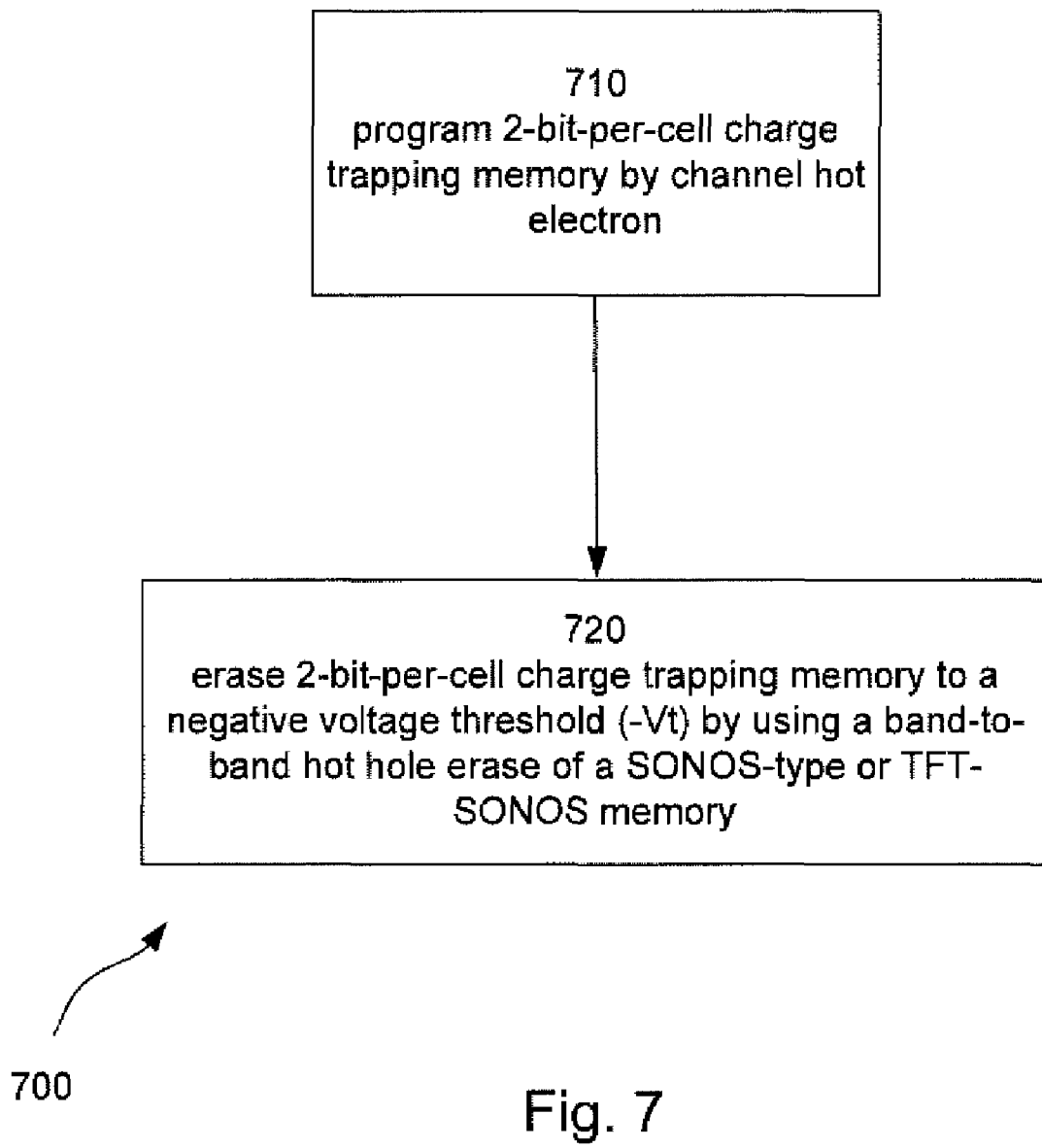
FIG. 7 is a flow diagram illustrating the process in the third embodiment of the erase method by band-to-band hot hole erase in accordance with the present invention.

FIG. 7 is a flow diagram illustrating the process 700 in the third embodiment of the erase method by band-to-band hot hole erase. At step 710, the SONOS memory cell 300 is programmed by using a channel hot electron technique. At step 720, the SONOS memory cell 300 is erased to a negative voltage threshold by using a band-to-band hot hole erase. The erase operation of the SONOS memory cell 300 to a negative voltage threshold increases a memory operation window and reduces the second bit effect. Alternatively, the SONOS memory cell 300 is erased to a voltage level lower than an initial voltage threshold by using the band-to-band hot hole erase technique.

FIG. 8A is a structural diagram illustrating the programming of the left bit (Bit-L) in a MNOS structure, and FIG. 8B is a corresponding graphical diagram of a two-bit-per-cell operation window that illustrates the second bit effect, which in this instance refers to the right bit (Bit-R). A second bit effect occurs in a charge trapping memory that employs a two-bit-per-cell operation, i.e. a left bit and right bit. When one of the two bits is programmed, the voltage threshold for the other bit may also increase even though only one bit is being programmed. The programming of a left bit is illustrated in FIG. 8A with an indication of charges 810 on a left side 812. Although only the left bit 812 is programmed, the programming of the left bit 812 also causes the voltage threshold of a right bit 814 to increase, as shown in FIG. 8B. A curve 820 illustrates that the voltage threshold of the right bit 814 drifts higher as the left bit 812 is being programmed. Such phenomenon is referred to as a second bit effect. An ideal curve, without the second bit effect, would show that a continuing programming of a left bit would cause the voltage threshold of the left bit to increase but the voltage threshold of the right bit would not be affected such that the voltage threshold of the right bit would remain substantially constant.

Figure 9B:
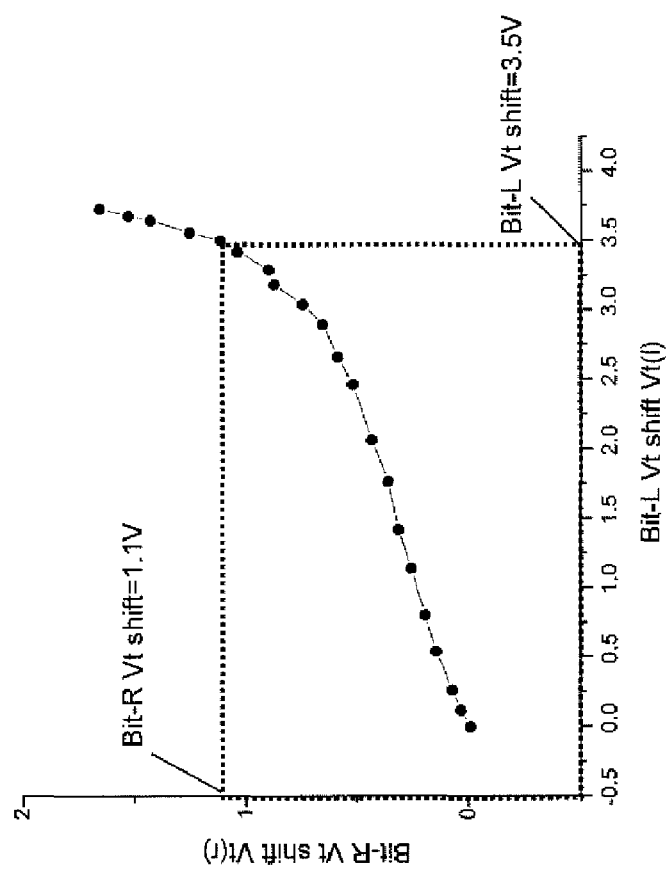
FIGS. 9A-B are graphical diagrams illustrating a second bit window of an MNOS memory cell with a voltage threshold of about zero volts with a notation of Vt in FIG. 9A and with a notation of Vt shift in FIG. 9B in accordance with the present invention.
Figure 9A:
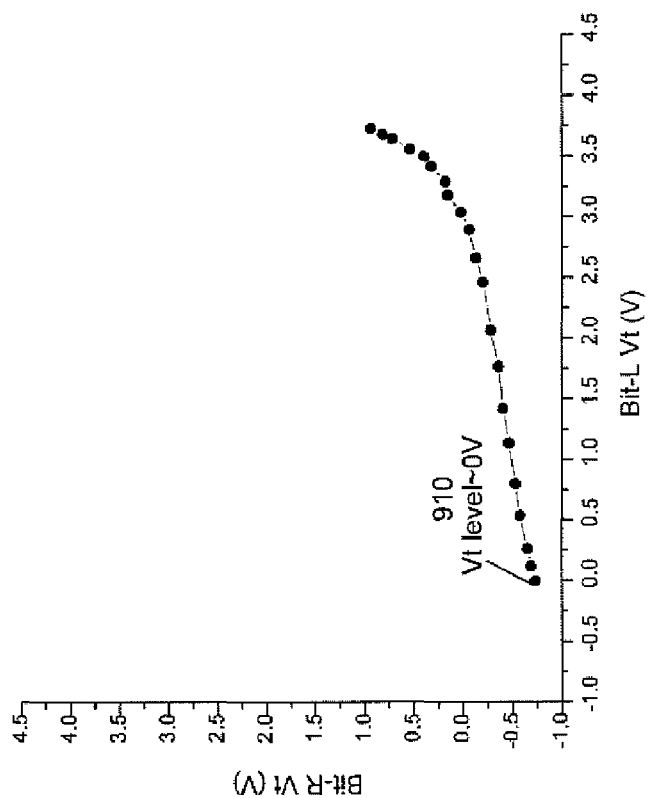

FIGS. 9A-B are graphical diagrams illustrating a second bit window of an MNOS memory cell with a voltage threshold of about zero volts with a notation of Vt in FIG. 9A and with a notation of Vt shift in FIG. 9B. A second bit window is defined as the difference between the shift in the voltage threshold of the right bit Vt(r) and the shift in the voltage threshold of the left bit Vt(l). As depicted in FIG. 9B, the voltage threshold of the left bit has shifted to about 3.5 volts, and the voltage threshold of the right bit has shifted to about 1.1 volts. Therefore, the second bit window in this instance is calculated as the difference between the shift in Vt(l) and shift in Vt(r), which is computed as follows: 3.5 volts−1.1 volts=2.4 volts.

Figure 10B:
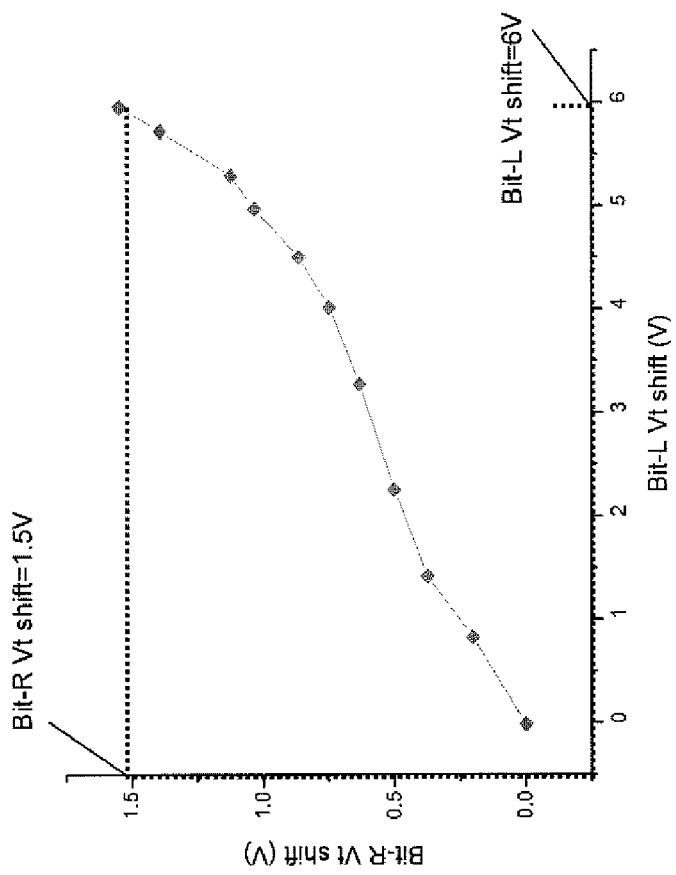
FIG. 10A and FIG. 10B is a graphical diagram illustrating a second bit window of an MNOS memory cell with a voltage threshold of negative voltage threshold level with a notation of Vt in FIG. 10A and with a notation of Vt shift in FIG. 10B in accordance with the present invention.
Figure 10A:
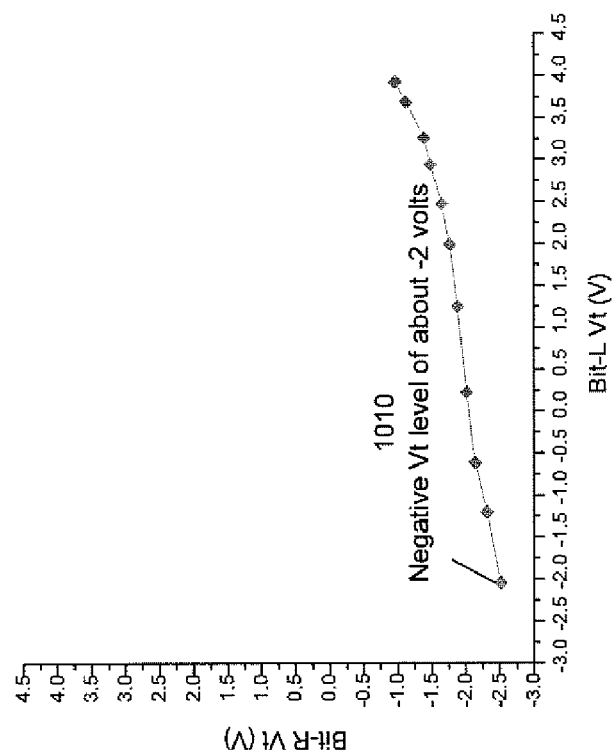

FIG. 10A and FIG. 10B is a graphical diagram illustrating a second bit window of an MNOS memory cell with a negative voltage threshold level with a notation of Vt in FIG. 10A and with a notation of Vt shift in FIG. 10B. As depicted in FIG. 10B, the voltage threshold of the left bit has shifted to about 6.0 volts, and the voltage threshold of the right bit has shifted to about 1.5 volts. Therefore, the second bit window in this instance is calculated as the difference between the shift in Vt(l) and shift in Vt(r), which is computed as follows: 6.0 volts−1.5 volts=4.5 volts. In comparison between erasing to about zero volts level as shown in FIG. 9A and erasing to a negative voltage threshold level as shown in FIG. 10A, the second bit window is significantly larger for an erase operation to a negative voltage threshold level than an erase operation to about zero volts.

Figure 11:
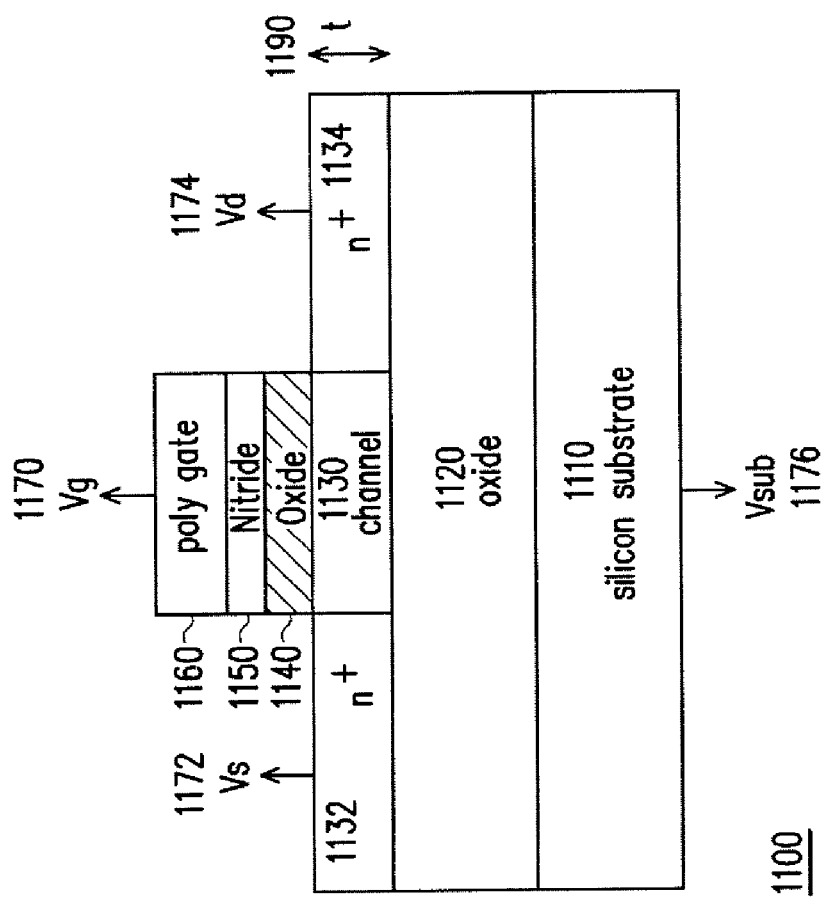
FIG. 11 is a process diagram illustrating a first embodiment implemented in a MNOS-SOI memory in accordance with the present invention.

In a second aspect of the invention, FIG. 11 is a process diagram illustrating a first embodiment implemented in an MNOS-SOI (silicon on insulator) memory 1100. The MNOS-SOI memory comprises an oxide layer 1120 overlying a silicon substrate 1110 to serve as an insulating material. In a SOI structure, a channel 1130 is formed between an n+ source region 1132 and an n+ drain region 1134 without applying a gate bias voltage Vg. The n+ source region 1132, the channel 1130 and the n+ drain region 1134 overlie the oxide layer 1120. The channel 1130 is deposited as a single crystal on the oxide 1120. The channel 1130 can be implemented with epitaxy silicon or poly silicon. An example of a suitable thickness t 1190 of the channel 1130 ranges from about 500 Å to about 1000 Å. A charge trapping layer 1150 overlies an oxide layer 1140, which is also referred to as a nitride-oxide (NO) stack. A poly gate 1160 overlies the charge trapping layer 1150. Some suitable materials for implementing the poly gate 1160 include an n-poly, a p-poly, or a metal gate. Without the presence of a top oxide overlying the charge trapping layer 1150, the erase operation, in using a hole tunneling injection, is able to more readily move holes through the poly gate and into the charge trapping layer 1150. A gate bias voltage 1170 is connected to the poly gate 1160, a source voltage 1172 is connected to the n+ source region 1132, a drain voltage 1174 is connected to the n+ drain region 1134, and a substrate voltage 1176 is connected to the silicon substrate 1110.

Figure 12:
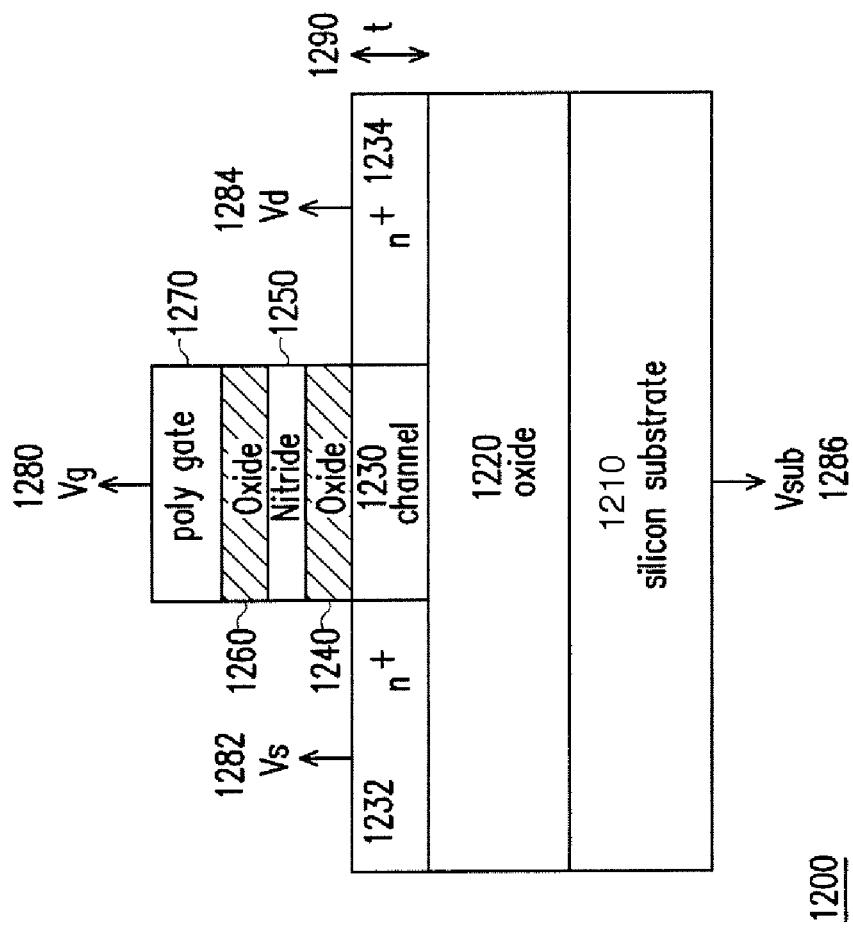
FIG. 12 is a process diagram illustrating a second embodiment implemented in a MONOS-SOI memory in accordance with the present invention.

FIG. 12 is a process diagram illustrating a second embodiment implemented in a MONOS-SOI memory 1200. The MONOS-SOI memory comprises an oxide layer 1120 overlying a silicon substrate 1210 to serve as an insulating material. In a SOI structure, a channel 1230 is formed between an n+ source region 1232 and an n+ drain region 1234 without applying a gate bias voltage Vg. The n+ source region 1232, the channel 1230 and the n+ drain region 1234 overlie the oxide layer 1220. The channel 1230 is deposited as a single crystal on the oxide 1220. The channel 1230 can be implemented with epitaxy silicon or poly silicon. An example of a suitable thickness t 1290 of the channel 1230 ranges from about 500 Å to about 1000 Å. A charge trapping layer 1250 overlies a bottom oxide layer 1240 and a top oxide layer 1260 overlies the charge trapping layer 1250, which are also referred to as an oxide-nitride-oxide stack. A poly gate 1270 overlies the top oxide layer 1260. Some suitable materials for implementing the poly gate 1270 include an n-poly, a p-poly, or a metal gate. In one embodiment, the top oxide layer 1260 is selected to be sufficiently thin so that holes are able to move through the poly gate 1270 and the top oxide layer 1260 to reach the charge trapping layer 1250 by hole tunneling injection. A gate bias voltage 1280 is connected to the poly gate 1270, a source voltage 1282 is connected to the n+ source region 1232, a drain voltage 1284 is connected to the n+ drain region 1234, and a substrate voltage 1286 is connected to the silicon substrate 1210.

Figures 13A, 13B:
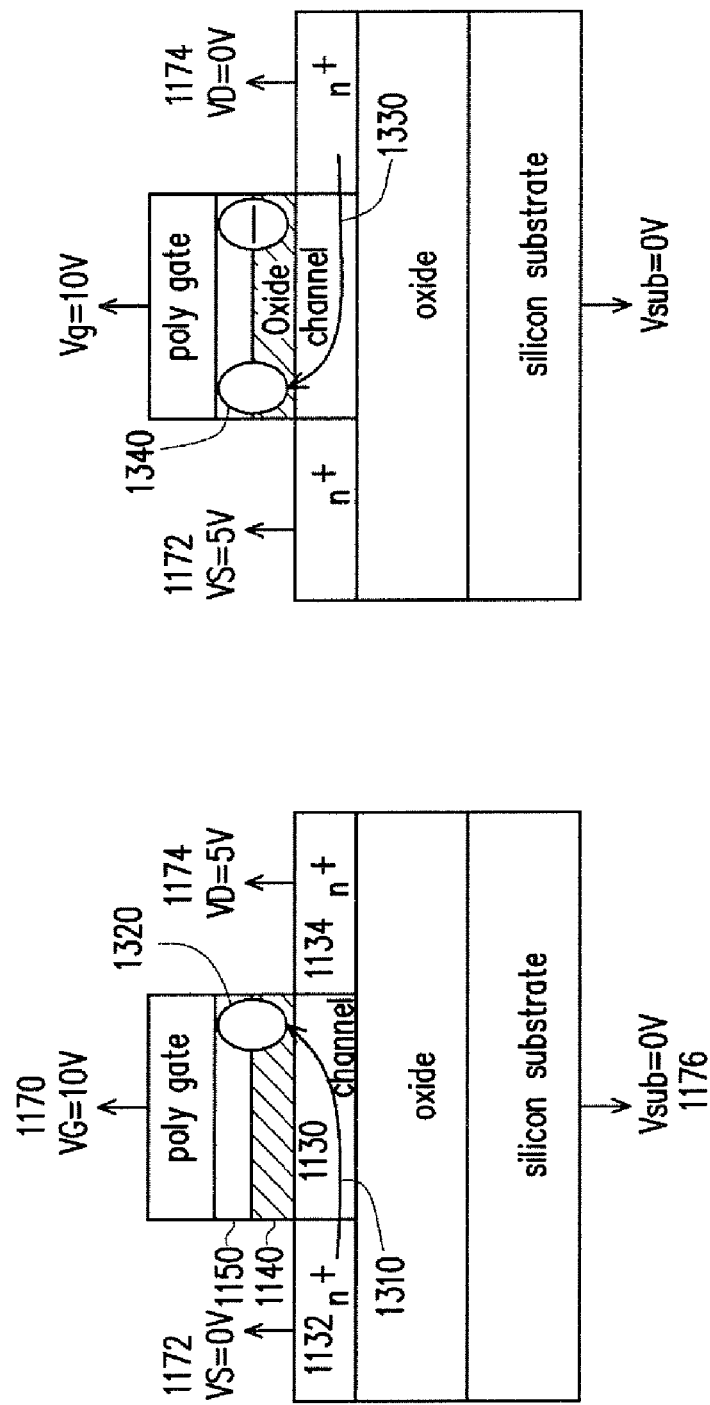
FIGS. 13A-13C are structural diagrams illustrating a first embodiment of an erase operation by hole tunneling erase in the MNOS-SOI memory in accordance with the present invention.
Figure 13C:
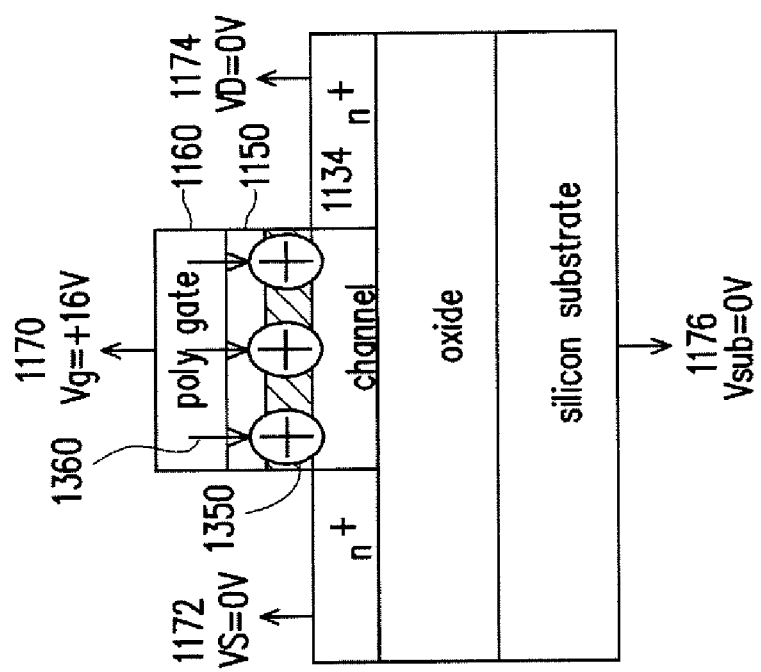

FIGS. 13A-13C are structural diagrams illustrating a first embodiment of an erase operation by hole tunneling erase in the MNOS-SOI memory 1100 or the MONOS-SOI memory 1200. In FIG. 13A, a channel hot electron is applied on a right bit of the MNOS-SOI memory 1100, as indicated by an arrow 1310 moving in the direction toward the right, and an electron 1320 is injected on the right side of the charge trapping layer 1150. The gate voltage Vg is applied with 10 volts, the substrate voltage Vsub is applied with 0 volts, the source voltage Vs is applied with zero volts, and the drain voltage Vd is applied with 5 volts. The voltage biasing in the source voltage Vs 1172 and the drain voltage Vd 1174 is reversed to conduct a channel hot electron on the left bit as shown in FIG. 13B by an arrow 1330 moving toward the left and an electron 1340 is injected on the left side of the charge trapping layer 1150. The source voltage Vs is applied with 5 volts, and the drain voltage is applied with 0 volts. During an erase operation, as shown in FIG. 13C, the gate voltage Vg 1170 is applied with a positive voltage of +16 volts, the substrate voltage Vs 1176 is applied with 0 volts, the source voltage Vs 1172 is applied with 0 volts, and the drain voltage Vd 1174 is applied with 0 volts. The hole tunneling erase operation causes holes 1350 to penetrate through the poly gate 1160 as indicated by arrows 1360 and into the charge trapping layer 1150.

Figure 14B:
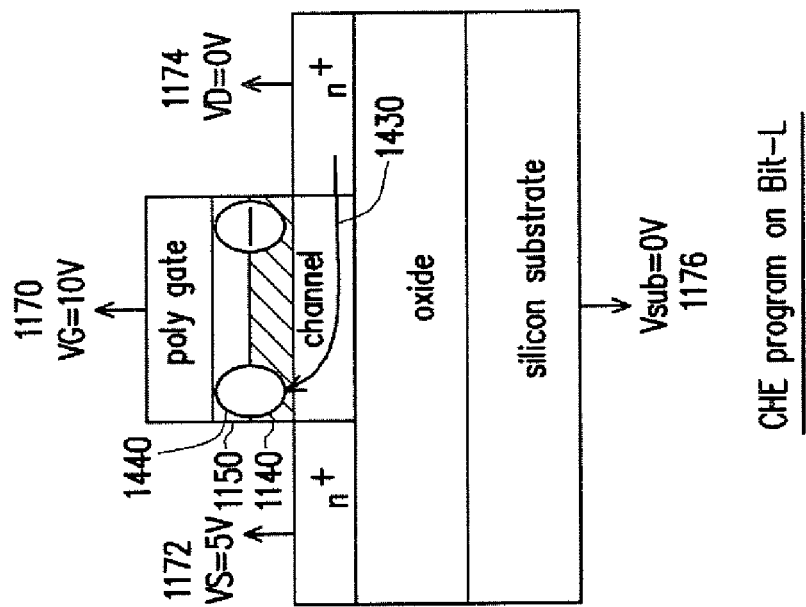
FIGS. 14A-14D are structural diagrams illustrating a second embodiment of an erase operation by band-to-band hot hole erase in the MNOS-SOI memory in accordance with the present invention.
Figure 14A:
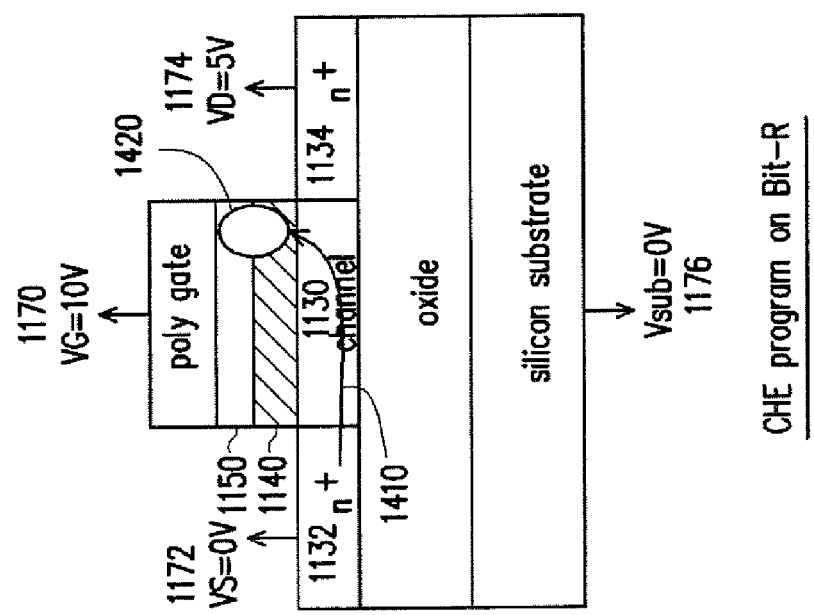
Figure 14C:
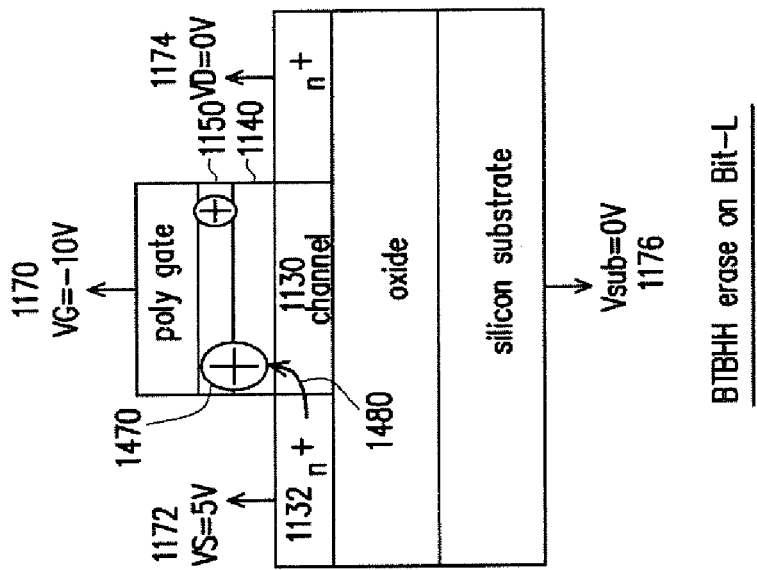
Figure 14D:
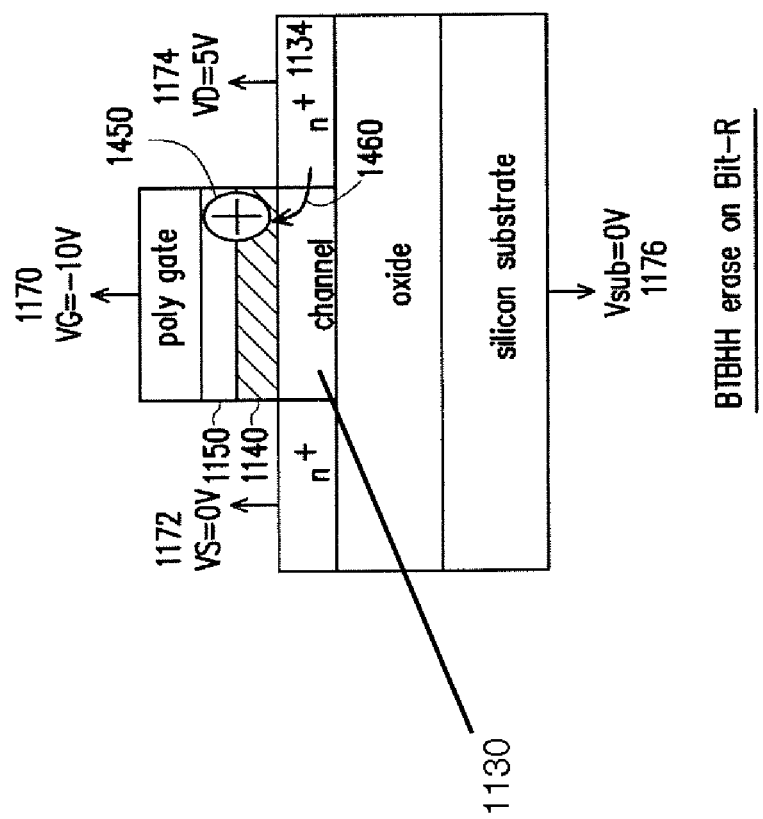

FIGS. 14A-14D are structural diagrams illustrating a second embodiment of an erase operation by band-to-band hot hole erase in the MNOS-SOI memory 1100 or the MONOS-SOI memory 1200. In FIG. 14A, a channel hot electron is applied on a right bit, Bit-R, of the MNOS-SOI memory 1100, as indicated by an arrow 1410 moving in the direction toward the right and an electron 1420 is injected on the right side of the charge trapping layer 1150. The gate voltage Vg is applied with 10 volts, the substrate voltage Vsub is applied with 0 volts, the source voltage Vs is applied with 0 volts, and the drain voltage Vd is applied with 5 volts. The voltage biasing in the source voltage Vs 1172 and the drain voltage Vd 1174 is reversed to conduct a channel hot electron on the left bit, as shown in FIG. 14B by an arrow 1430 moving toward the left and an electron 1440 injected on the left side of the charge trapping layer 1140. The source voltage Vs is applied with 5 volts, and the drain voltage is applied with 0 volts. An erase operation is carried out using a band-to-band hot hole erase on a right bit as shown in FIG. 14C and on a left bit, as shown in FIG. 14D. The gate voltage Vg 1170 is applied with a positive voltage of +10 volts, the substrate voltage Vs 1176 is applied with 0 volts, the source voltage Vs 1172 is applied with 0 volts, and the drain voltage Vd 1174 is applied with 5 volts. The band-to-band hot hole erase on the right bit causes holes 1450 to move from the n+ drain region 1134 into the channel 1130, through the oxide layer 1140, and into the charge trapping layer 1150, as indicated by an arrow 1460. The gate voltage Vg 1170 is applied with a negative voltage of −10 volts, the substrate voltage Vs 1176 is applied with 5 volts, the source voltage Vs 1172 is applied with 0 volts, and the drain voltage Vd 1174 is applied with 0 volts. The band-to-band hot hole erase on the left bit causes holes 1470 to move from the n+ source region 1132 into the channel 1130, through the oxide layer 1140, and into the charge trapping layer 1150, as indicated by an arrow 1480.

FIG. 15A is a structural diagram illustrating the programming of the left bit (Bit-L) in the MNOS-SOI memory 1100 or the MONOS-SOI memory 1200, and FIG. 15B is a corresponding graphical diagram of a two-bit-per-cell operation window that illustrates the second bit effect, which in this instance refers to the right bit (Bit-R). A second bit effect occurs in a memory cell that employs a two-bit operation, i.e. a left bit and right bit. When one of the two bits is programmed, the voltage threshold for the other bit may also increase even though only one bit is programmed. The programming of a left bit is illustrated in FIG. 15A with an indication of charges 1510 on a left bit 1512. Although only the left bit 1512 is programmed, the programming of the left bit 1512 also causes the voltage threshold of a right bit 1514 to increase, as shown in FIG. 15B. A curve 1520 illustrates that the voltage threshold of right bit 1514 increases as the left bit 1512 is programmed. Such a phenomenon is referred to as a second bit effect. An ideal curve, without the second bit effect, would reflect that a continuing programming of a left bit would cause the voltage threshold of the left bit to increase but the voltage threshold of the right bit would not be affected such that the voltage threshold of the right bit remains substantially constant.

Figure 16:
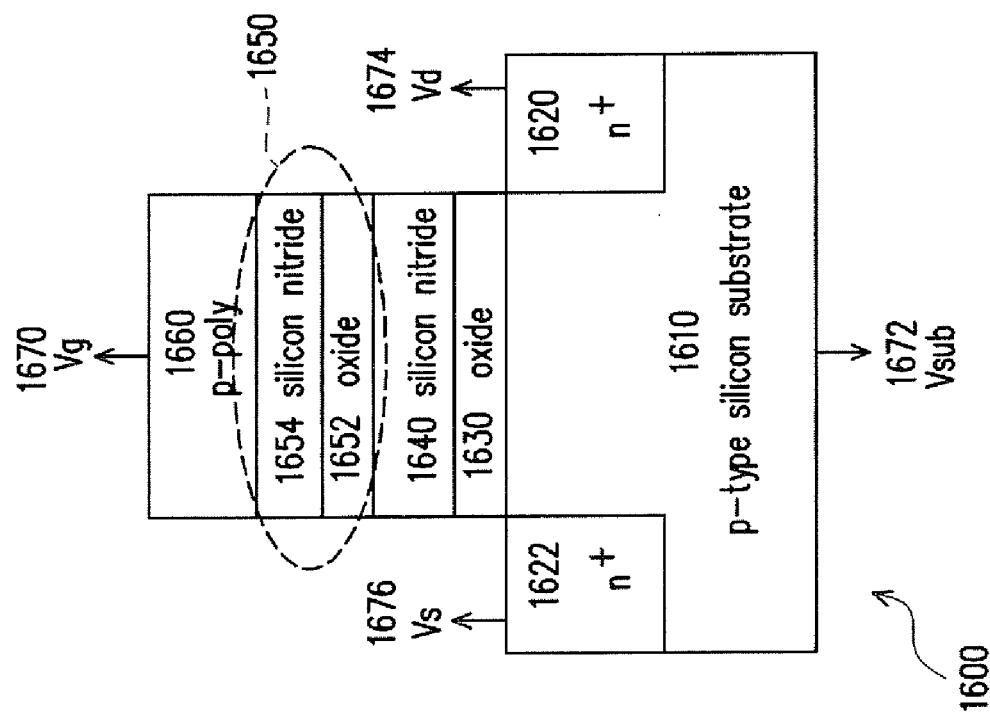
FIG. 16 illustrates a first embodiment of a top oxide with a multi-layer dielectric structure implemented in an MNONOS thin film transistor memory for use with a turn-on mode operation in accordance with the present invention.

In a third aspect of the invention, FIG. 16 illustrates a first embodiment of a top oxide with a multi-layer dielectric structure implemented in an MNONOS memory 1600 comprising in a turn-on mode operation. The MNONOS memory 1600 is fabricated on a silicon substrate 1610. A drain n+ doped region 1620 and a source n+ doped region 1622 are formed on the upper right side and the upper left side of the p-type silicon substrate 1610. A bottom dielectric structure 1630, such as an oxide, overlays the silicon substrate 1610 and a charge trapping layer 1640 comprising a silicon nitride layer that overlays the bottom dielectric structure 1630. A top dielectric structure 1650 overlays the charge trapping layer 1640. The top dielectric structure 1650 has multiple layers comprising a silicon nitride layer 1654 overlaying an oxide layer 1652, which is also referred to as an N—O stack. A p-poly layer 1660 overlays the top dielectric structure 1650. Other suitable materials can be implemented in place of the p-poly layer 1660, such as n-poly or a metal gate. A gate voltage 1670, Vg, is applied to the p-poly 1660, and a substrate voltage 1672, Vsub, is applied to the p-type silicon substrate 1610. A drain voltage Vd 1674 is applied to the drain n+ doped region 1620, and a source voltage Vs 1676 is applied to the source n+ doped region 1622.

Figure 17:
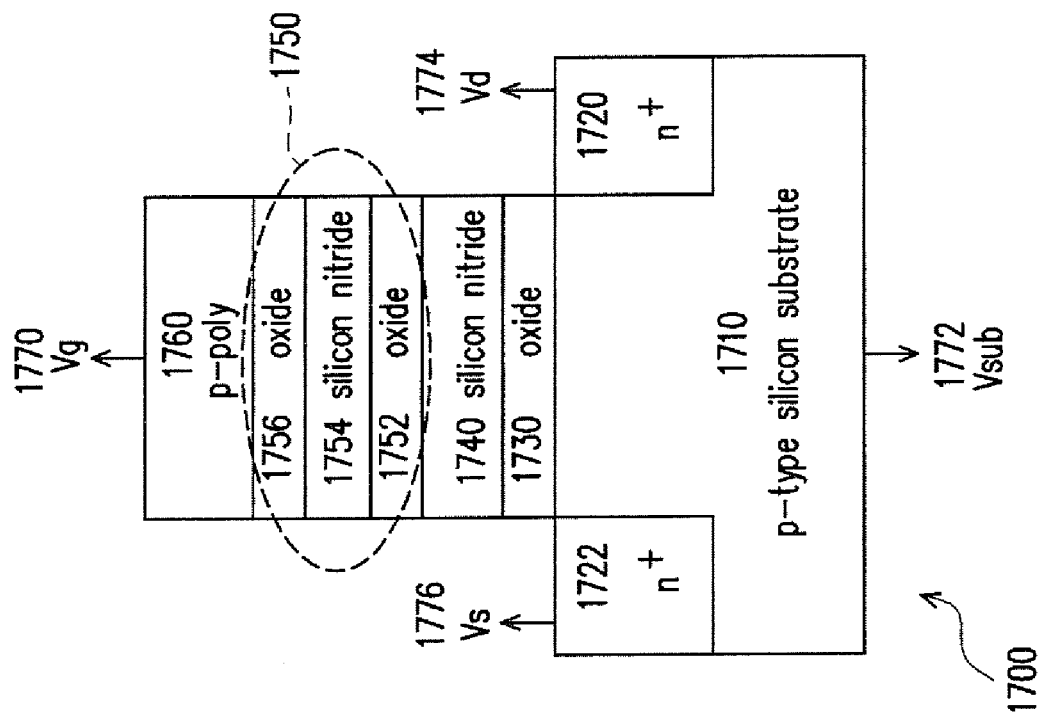
FIG. 17 illustrates a second embodiment of a top oxide with a multi-layer stack structure implemented in an MONONOS memory for use in the turn-on mode operation in accordance with the present invention.

FIG. 17 illustrates a second embodiment of a top oxide with a multi-layer stack structure implemented in a MONONOS memory 1700 in a turn-on mode operation. The MNONONOS memory 1700 is fabricated on a p-type silicon substrate 1710, instead of a conventional silicon substrate. A drain n+ doped region 1720 and a source n+ doped region 1722 are formed on the upper right side and the upper left side of the p-type silicon substrate 1710. A dielectric structure 1730, such as an oxide, overlays the substrate 1710 and a silicon nitride layer 1740 overlays the bottom dielectric structure 1730. A top dielectric structure 1750 overlays the silicon nitride layer 1740. The top dielectric structure 1750 has multiple layers comprising an oxide 1756 overlaying a silicon nitride layer 1754, and the silicon nitride layer 1754 overlaying an oxide layer 1752, which is also referred to as an O—N—O stack. A p-poly layer 1760 overlays the top dielectric structure 1750. Other suitable materials can be implemented in place of the p-poly layer 1760, such as n-poly or a metal gate. A gate voltage 1770, Vg, is applied to the p-poly 1760, and a substrate voltage 1772, Vsub, is applied to the p-type poly substrate 1710. A drain voltage Vd 1774 is applied to the drain n+ doped region 1720, and a source voltage Vs 1776 is applied to the source n+ doped region 1722.

FIGS. 18A-18C are structural diagrams illustrating a first method for increasing a second bit window in a top multi-layer dielectric structure for use in a turn-on mode operation, which are applicable to both the first and second embodiments of the MNONOS memory 1600 and the MNONONOS memory 1700. FIG. 18A is a structural diagram illustrating the programming of the MNONOS memory 1600 by channel hot electron at a right bit location. A directional arrow 1810 indicates that the channel hot electron is applied to a right bit, as shown with electrons 1820 in the charge trapping layer 1640. The gate voltage Vg 1670 is applied 8 volts, the drain voltage Vd 1674 is applied 5 volts, the source voltage Vs 1676 is applied 0 volts, and the substrate voltage Vsub 1672 is applied 0 volts. The combination of these applied voltages result in of the right bit in the MNONOS memory 1600 to a positive voltage threshold +Vt.

FIG. 18B is a structural diagram illustrating the programming of the MNONOS memory 1600 by channel hot electron at a left bit location. A directional arrow 1830 indicates that the channel hot electron is applied to the left bit, as shown with electrons 1840 in the charge trapping layer 1640. The gate voltage Vg 1670 is applied 8 volts, the drain voltage Vd 1674 is applied 0 volts, the source voltage Vs 1676 is applied 5 volts, and the substrate voltage Vsub 1672 is applied 0 volts. The combination of these applied voltages result in channel hot electron of the left bit in the MNONOS memory 1600 to a positive voltage threshold +Vt.

FIG. 18C is a structural diagram illustrating a hole injection erase of the MNONOS memory 1600 by hole tunneling. During the erase operation, the hole tunneling erase is carried out on a left bit in a direction as indicated by an arrow 1850 by moving hole charges 1860a through the p-poly 1660, the silicon nitride layer 1654, and the oxide 1652 into the charge trapping layer 1640. The hole tunneling erase is also carried out on a right bit by moving hole charges 1860b through the p-poly 1660, the silicon nitride layer 1654, and the oxide 1652 into the charge trapping layer 1640. The gate voltage Vg 1670 is applied with 16 volts, the drain voltage Vd 1674 is applied with 0 volts, the source voltage Vs 1676 is applied with 0 volts, and the substrate voltage Vsub 1672 is applied with 0 volts. The combination of these applied voltages causes hole injection erase by hole tunneling in moving hole charges through the p-poly 1660, the silicon nitride layer 1654, and the oxide 1652 into the charge trapping layer 1640.

The gate bias voltage Vg can be modified so that it is suitable for a low voltage operation. FIGS. 19A-19C are structural diagrams illustrating a second method for increasing a second bit window in a top multi-layer dielectric structure for use in a turn-on mode operation, which are applicable to both the first and second embodiments of the MNONOS memory 1600 and the MNONONOS memory 1700. FIGS. 19A-B are structural diagrams illustrating the programming of the MNONOS memory 1600 by channel hot electron at a right bit location and a left bit location, respectively, that are similar to the descriptions as in FIGS. 18A-B. A directional arrow 1910 indicates that the channel hot electron is applied to a right bit location, as shown with electrons 1920 in the charge trapping layer 1640. The gate voltage Vg 1670 is applied with 8 volts, the drain voltage Vd 1674 is applied with 5 volts, the source voltage Vs 1676 is applied with 0 volts, and the substrate voltage Vsub 1672 is applied with 0 volts. The combination of these applied voltages results in channel hot electron of the right bit in the MNONOS memory 1600 to a positive voltage threshold+Vt.

FIG. 19B is a structural diagram illustrating the programming of the MNONOS memory 1600 by channel hot electron at a left bit location. A directional arrow 1930 indicates that the channel hot electron is applied to the left bit, as shown with electrons 1940 in the charge trapping layer 1640. The gate voltage Vg 1670 is applied with 8 volts, the drain voltage Vd 1674 is applied with 0 volts, the source voltage Vs 1676 is applied with 5 volts, and the substrate voltage Vsub 1672 is applied with 0 volts. The combination of these applied voltages results in channel hot electron of the left bit in the MNONOS memory 1600 to a positive voltage threshold+Vt.

FIG. 19C is a structural diagram illustrating a hole injection erase of the MNONOS memory 1600 by hole tunneling. During the erase operation, the hole tunneling erase is carried out on a left bit by moving hole charges 1960a through the p-poly 1660, the silicon nitride layer 1654, and the oxide 1652 into the charge trapping layer 1640. The hole tunneling erase is applied to a right bit in a direction as indicated by an arrow 1950 by moving hole charges 1960b through the p-poly 1660, the silicon nitride layer 1654, and the oxide 1652 into the charge trapping layer 1640. The gate voltage Vg 1670 is applied with 8 volts, the drain voltage Vd 1674 is applied with 0 volts, the source voltage Vs 1676 is applied with 0 volts, and the substrate voltage Vsub 1672 is applied with −8 volts. The combination of these applied voltages causes hole injection erase by hole tunneling in moving hole charges through the p-poly 1660, the silicon nitride layer 1654, and the oxide 1652 into the charge trapping layer 1640. The second operation method is suitable for a low voltage operation by reducing the gate bias voltage from +16 volts to +8 volts, and by applying −8 volts to the silicon substrate 1610.

FIG. 20A is a structural diagram illustrating the programming of the left bit in the MNONOS memory 1600 or the MNONONOS memory 1700, and FIG. 20B is a corresponding graphical diagram of a two-bit-per-cell operation window that illustrates the second bit effect, which in this instance refers to the right bit. A second bit effect occurs in a memory cell that employs a two-bit operation, i.e. a left bit and right bit. When one of the two bits is programmed, the voltage threshold for the other bit may also increase even though only one bit is programmed. The programming of a left bit is illustrated in FIG. 20A with an indication of charges 2010 on a left bit 2012. Although only the left bit 2012 is programmed, the programming of the left bit 2012 also causes the voltage threshold of a right bit 2014 to increase, as shown in FIG. 20B. A curve 2020 illustrates that the voltage threshold of right bit 2014 increases as the left bit 2012 is programmed. Such phenomenon is referred to as a second bit effect. An ideal curve, without the second bit effect, would involve a continuing programming of a left bit which would cause the voltage threshold of the left bit to increase but the voltage threshold of the right bit would not be affected such that the voltage threshold of the right bit would remain substantially constant.

The MNONOS memory 1600 with the p-type silicon substrate and MONONOS memory 1700 with the p-type silicon substrate are intended as illustrations for carrying out the turn-on mode operation in the third aspect of the invention with reference to FIGS. 16-20. Other memory structures can also be practiced within the spirits of the present invention, including MNONOS TFT memory and MONONOS TFT memory.

In a fourth aspect of the invention, FIG. 21 illustrates a first embodiment of a bottom oxide with a multi-layer dielectric structure implemented in a MONONS memory 2100 for use in a turn-on mode operation. The MONONS memory 2100 is fabricated on a p-type silicon substrate 2110 with a drain n+ doped region 2120 and a source n+ doped region 2122 that are formed on the upper right side and the upper left side of the p-type silicon substrate 2110, respectively. A bottom dielectric structure 2130 overlays the p-type silicon substrate 2110. The bottom dielectric structure 2130 has multiple layers comprising an oxide 2134 overlaying a silicon nitride layer 2132, which is also referred to as O—N layers. A silicon nitride layer 2140 overlays the bottom dielectric structure 2130, an oxide layer 2150 overlays the silicon nitride 2140, and a p-poly 2160 overlays the oxide layer 2150. Other suitable materials can be implemented in place of the p-poly layer 2160, such as n-poly or a metal gate. A gate voltage 2170 Vg is applied to the p-poly 2160, and a substrate voltage 2176 Vsub is applied to the p-type silicon substrate 2110. A drain voltage Vd 2172 is applied to the drain n+ doped region 2120, and a source voltage Vs 2174 is applied to the source n+ doped region 2122.

Referring now to FIG. 22, there is shown a third embodiment of a bottom oxide with a multi-layer dielectric structure implemented in a MONONOS memory 2200 for use in a turn-on mode operation. The MONONOS memory 2200 is fabricated on a p-type silicon substrate 2210 with a drain n+ doped region 2220 and a source n+ doped region 2222 that are formed on the upper right side and the upper left side of the p-type silicon substrate 2210. A bottom dielectric structure 2230 overlays the p-type silicon substrate 2210. The bottom dielectric structure 2230 has multiple layers comprising an oxide 2236 overlaying a silicon nitride layer 2234, and the silicon nitride layer 2234 overlaying the oxide 2232, which is also referred to as O—N—O layers. A silicon nitride layer 2240 overlays the bottom dielectric structure 2230, an oxide layer 2250 overlays the silicon nitride 2240, and a p-poly 2260 overlays the oxide layer 2250. Other suitable materials can be implemented in place of the p-poly layer 2260, such as n-poly or a metal gate. A gate voltage 2270 Vg, is applied to the p-poly 2260, and a substrate voltage 2276 Vsub is applied to the p-type silicon substrate 2210. A drain voltage Vd 2272 is applied to the drain n+ doped region 2220, and a source voltage Vs 2274 is applied to the source n+ doped region 2222.

In FIG. 23, there is shown a third embodiment of a bottom oxide with a multi-layer dielectric structure implemented in a MONONS TFT memory 2300 on a poly substrate for use in a turn-on mode operation. The MONONS TFT memory 2300 is fabricated on a p-type poly substrate 2310 with a drain n+ doped region 2320 and a source n+ doped region 2322 that are formed on the upper right side and the upper left side of the p-type poly substrate 2310, respectively. A bottom dielectric structure 2330 overlays the p-type poly substrate 2310. The bottom dielectric structure 2330 has multiple layers that comprise an oxide 2334 overlaying a silicon nitride layer 2332, which is also referred to as O—N layers. A silicon nitride layer 2340 overlays the bottom dielectric structure 2330, an oxide layer 2350 overlays the silicon nitride 2340, and a p-poly 2360 overlays the oxide layer 2350. Other suitable materials can be implemented in place of the p-poly layer 2360, such as n-poly or a metal gate. A gate voltage 2370 Vg is applied to the p-poly 2360, and a substrate voltage 2376 Vsub is applied to the p-type poly substrate 2310. A drain voltage Vd 2372 is applied to the drain n+ doped region 2320, and a source voltage Vs 2374 is applied to the source n+ doped region 2322.

FIG. 24 illustrates a fourth embodiment of a bottom oxide with a multi-layer dielectric structure implemented in a MONONOS TFT memory 2400 on a poly substrate for use in a turn-on mode operation. The MONONOS TFT memory 2400 is fabricated on a p-type poly substrate 2410 with a drain n+ doped region 2420 and a source n+ doped region 2422 that are formed on the upper right side and the upper left side of the p-type poly substrate 2410, respectively. A bottom dielectric structure 2430 overlays the p-type poly substrate 2410. The bottom dielectric structure 2430 has multiple layers comprising an oxide 2436 overlaying a silicon nitride layer 2434, and the silicon nitride layer 2434 overlaying the oxide 2432, which is also referred to as O—N—O layers. A silicon nitride layer 2440 overlays the bottom dielectric structure 2430, an oxide layer 2450 overlays the silicon nitride 2440, and a p-poly 2460 overlays the oxide layer 2450. Other suitable materials can be implemented in place of the p-poly layer 2460, such as n-poly or a metal gate. A gate voltage 2470 Vg is applied to the p-poly 2460, and a substrate voltage 2476 Vsub is applied to the p-type poly substrate 2410. A drain voltage Vd 2472 is applied to the drain n+ doped region 2420, and a source voltage Vs 2474 is applied to the source n+ doped region 2422.

Figures 25, 26:
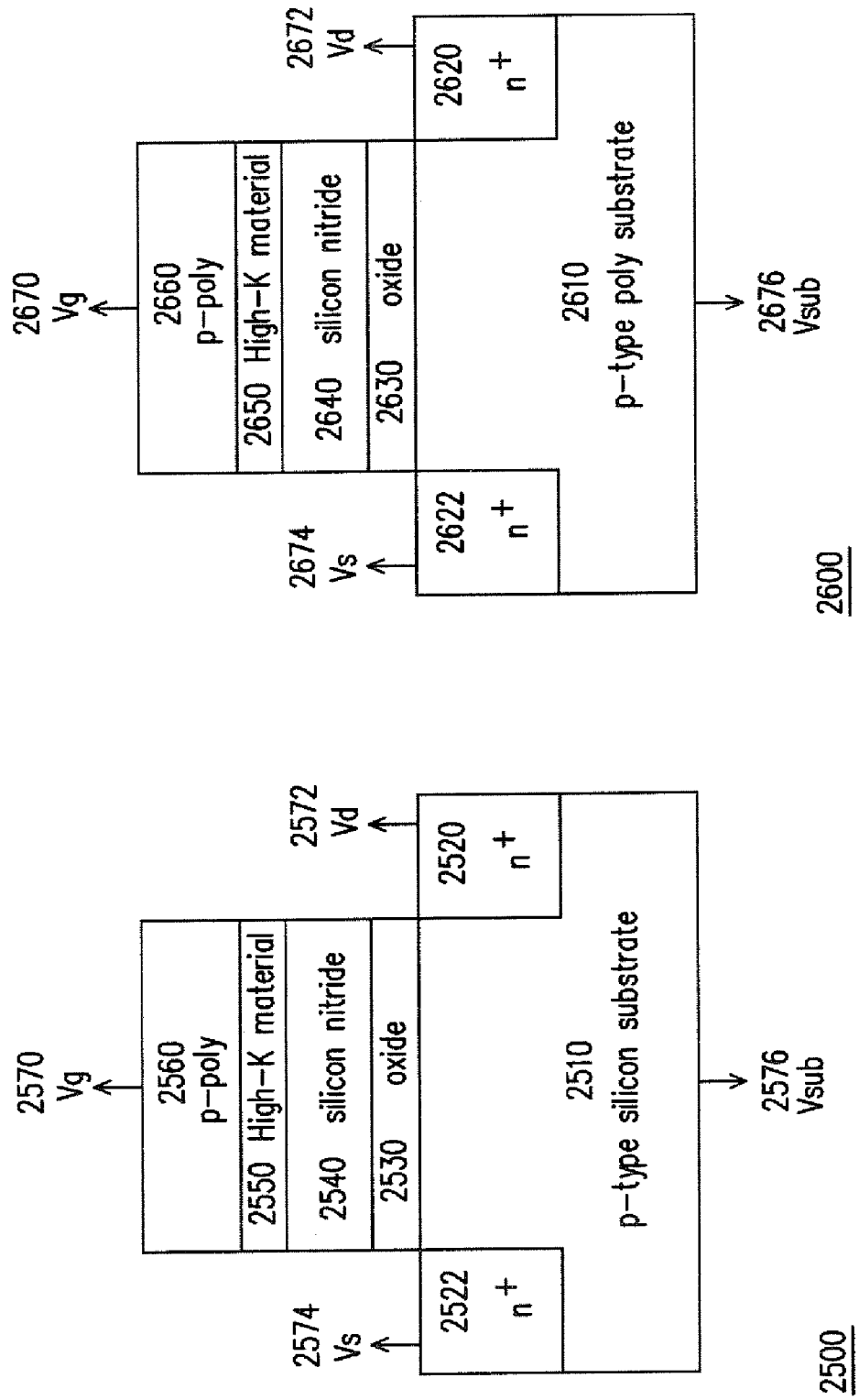
FIG. 25 illustrates a first embodiment of a M(HK)NOS memory structure having two bits per cell with a high-K material stack on a silicon substrate for use in the turn-on mode operation in accordance with the present invention.
FIG. 26 illustrates a second embodiment of a M(HK)NOS memory structure with a high-K material stack on a poly substrate for use in the turn-on mode operation in accordance with the present invention.

Turning now to FIG. 25, there is shown a first embodiment of an M(HK)NOS memory 2500 having two bits per cell with a high-K material stack on a silicon substrate for use in a turn-on mode operation. The M(HK)NOS memory 2500 is fabricated on a p-type silicon substrate 2510 with a drain n+ doped region 2520 and a source n+ doped region 2522 that are formed on the upper right side and the upper left side of the p-type silicon substrate 2510, respectively. A bottom dielectric layer 2530 comprising an oxide layer overlies the p-type silicon substrate 2510, and a charge trapping layer 2540 comprising a silicon nitride layer overlies the bottom dielectric layer 2530. A high-K material stack 2550 is disposed over the charge trapping layer 2540, and a p-poly layer 2560 is disposed over the high-K material stack 2550. A gate voltage 2570 Vg is applied to the p-poly 2560, and a substrate voltage 2576 Vsub is applied to the p-type silicon substrate 2510. A drain voltage Vd 2572 is applied to the drain n+ doped region 2520, and a source voltage Vs 2574 is applied to the source n+ doped region 2522.

The high-K material stack 2550 is selected from a dielectric material that possesses a higher dielectric constant than the bottom dielectric layer 2530 in one embodiment. The bottom dielectric material 2530 may be implemented with silicon dioxide, $SiO_2$, which has a dielectric constant k value of about 3.9. A high-K material increases capacitance, or remains unchanged in the reduced area of a MOS gate and a gate dielectric so that it is sufficiently thick to prevent excessive tunneling current. In another embodiment, the high-K material stack 2550 is selected from a dielectric material that possesses a higher dielectric constant than the charge trapping layer 2540. Some examples of suitable high-K dielectric materials 2550 include aluminum oxide $Al_2O_3$, and hafnium oxide $HfO_2$. The description of the high-K material stack is also applicable to the embodiment described with respect to FIG. 26.

FIG. 26 illustrates a second embodiment of an M(HK)NOS memory structure 2600 with a high-K material stack on a poly substrate for use in a turn-on mode operation. The M(HK)NOS memory 2600 is fabricated on a p-type poly substrate 2610 with a drain n+ doped region 2620 and a source n+ doped region 2622 that are formed on the upper right side and the upper left side of the p-type silicon substrate 2610. A bottom dielectric layer 2630 overlies the p-type poly substrate 2610, and a silicon nitride layer 2640 overlies the bottom dielectric layer 2630. A high-K material stack 2650 is disposed over the silicon nitride layer 2640, and a p-poly layer 2660 is disposed over the high-K material stack 2650. A gate voltage 2670, Vg, is applied to the p-poly 2660, and a substrate voltage 2676, Vsub, is applied to the p-type poly substrate 2610. A drain voltage Vd 2672 is applied to the drain n+ doped region 2620, and a source voltage Vs 2674 is applied to the source n+ doped region 2622.

Figures 27A, 27B, 27C:
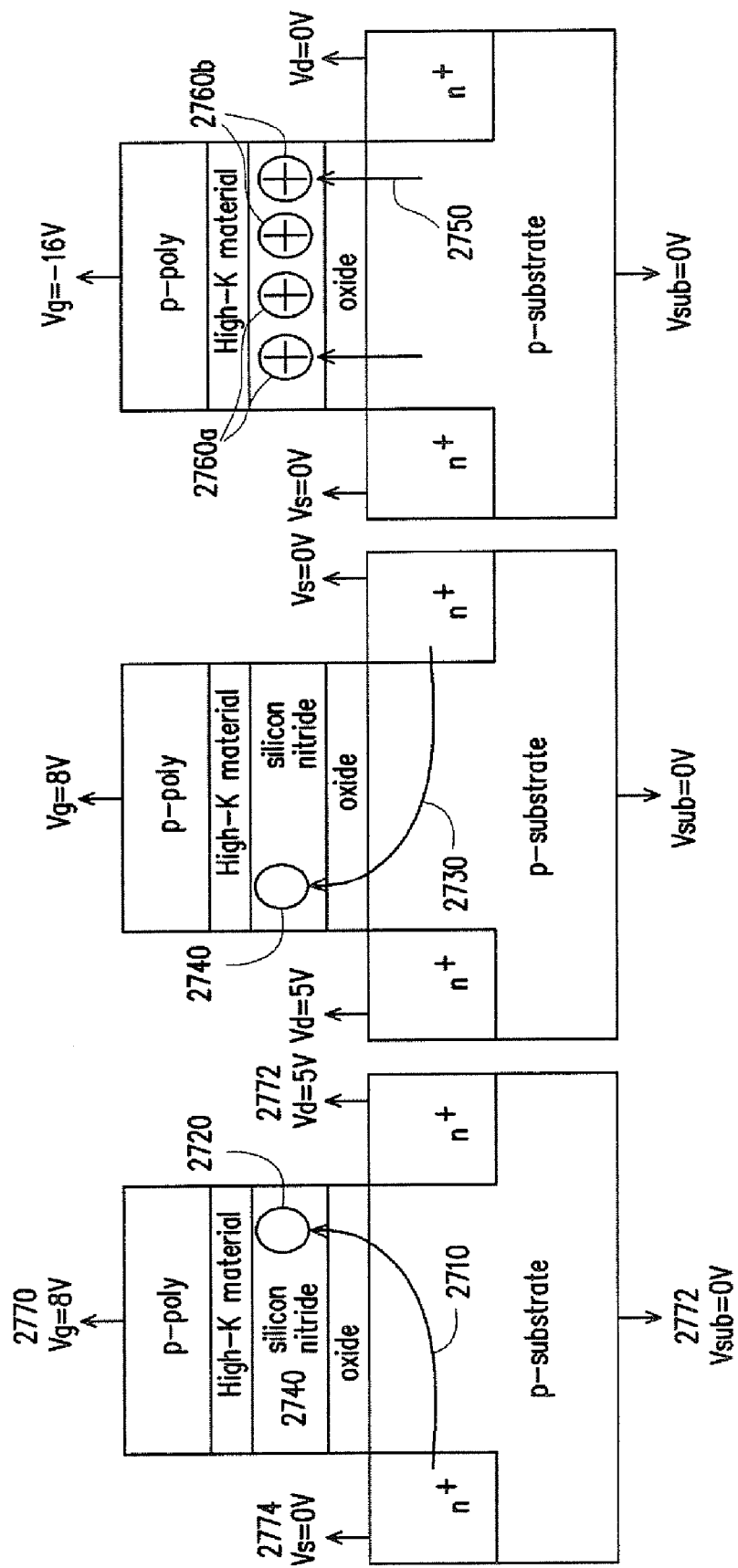
FIGS. 27A-27C are structural diagrams illustrating a first method for increasing a second bit window of a M(HK)NOS memory structure with a high-K material stack on either a silicon substrate or a poly substrate for use in the turn-on mode operation in accordance with the present invention.

FIGS. 27A-27C are structural diagrams illustrating a first method for increasing a second bit window of an M(HK)NOS memory 2500 or 2600 with a high-K material stack on either a silicon substrate or a poly substrate for use in a turn-on mode operation. FIG. 27A is a structural diagram illustrating the programming of the M(HK)NOS memory 2500 or 2600 by channel hot electron at a right bit location. A directional arrow 2710 indicates that the channel hot electron is applied to the right bit, as shown with electrons 2720 in the charge trapping layer 2540. The gate voltage Vg 2570 is applied with 8 volts, the drain voltage Vd 2574 is applied with 5 volts, the source voltage Vs 2576 is applied with 0 volts, and the substrate voltage Vsub 2572 is applied with 0 volts. The combination of these applied voltages results in channel hot electron of the right bit in the M(HK)NOS memory 2500 or 2600 to a positive voltage threshold+Vt.

FIG. 27B is a structural diagram illustrating the programming of the M(HK)NOS memory 2500 or 2600 by channel hot electron at a left bit location. A directional arrow 2730 indicates that the channel hot electron is applied to the left bit, as shown with electrons 2740 in the charge trapping layer 2540. The gate voltage Vg 2570 is applied with 8 volts, the drain voltage Vd 2574 is applied with 0 volts, the source voltage Vs 2576 is applied with 5 volts, and the substrate voltage Vsub 2572 is applied with 0 volts. The combination of these applied voltages results in channel hot electron of the left bit in the M(HK)NOS memory 2500 or 2600 to a positive voltage threshold +Vt. FIG. 27C is a structural diagram illustrating a hole injection erase of the M(HK)NOS memory 2500 or 2600 by hole tunneling. During the erase operation, the hole tunneling erase is carried out on the left bit by moving hole charges 2760a through the p-type substrate 2510 (either a p-type silicon substrate or a p-type poly substrate), and through the bottom dielectric layer 2530 and into the charge trapping layer 2540. The hole tunneling erase is also carried out on a right bit in a direction as indicate by an arrow 2750 by moving hole charges 2760b through the p-type substrate 2510 (either a p-type silicon substrate or a p-type poly substrate), the bottom dielectric layer 2530, and into the charge trapping layer 2540. The gate voltage Vg 2570 is applied with a negative voltage of −16 volts, the drain voltage Vd 2574 is applied with 0 volts, the source voltage Vs 2576 is applied with 0 volts, and the substrate voltage Vsub 2572 is applied with 0 volts. The combination of these applied voltages causes hole injection erase by hole tunneling by moving hole charges through the p-type substrate 2510, the bottom dielectric layer 2530, and into the charge trapping layer 2540.

FIGS. 28A-28C are structural diagrams illustrating a second method for increasing a second bit window of an M(HK)NOS memory 2500 or 2600 with a high-K material stack on either a silicon substrate or a poly substrate for use in a turn-on mode operation. FIG. 28A is a structural diagram illustrating the programming of the M(HK)NOS memory 2500 or 2600 by channel hot electron at a right bit location. A directional arrow 2810 indicates that the channel hot electron is applied to the right bit as shown with electrons 2820 in the charge trapping layer 2540. The gate voltage Vg 2570 is applied with 8 volts, the drain voltage Vd 2574 is applied with 5 volts, the source voltage Vs 2576 is applied with 0 volts, and the substrate voltage Vsub 2572 is applied with 0 volts. The combination of these applied voltages results in channel hot electron of the right bit in the M(HK)NOS memory 2500 or 2600 to a positive voltage threshold +Vt.

FIG. 28B is a structural diagram illustrating the programming of the M(HK)NOS memory 2500 or 2600 by channel hot electron at a left bit location. A directional arrow 2830 indicates that the channel hot electron is applied to the left bit, as shown with electrons 2840 in the charge trapping layer 2540. The gate voltage Vg 2570 is applied with 8 volts, the drain voltage Vd 2574 is applied with 0 volts, the source voltage Vs 2576 is applied with 5 volts, and the substrate voltage Vsub 2572 is applied with 0 volts. The combination of these applied voltages results in channel hot electron of the left bit in the M(HK)NOS memory 2500 or 2600 to a positive voltage threshold +Vt.

FIG. 28C is a structural diagram illustrating a hole injection erase of the M(HK)NOS memory 2500 or 2600 by hole tunneling. During the erase operation, the hole tunneling erase is carried out on the left bit in a direction as indicate by an arrow 2850 by moving hole charges 2860a through a left bit by moving hole charges 2860a though the p-poly 2560, the high-K material 2550, and into the charge trapping layer 2540. The hole tunneling erase is also carried out on a right bit by moving hole charges 2860b though the p-poly 2560, the high-K material 2550, and into the charge trapping layer 2540. The gate voltage Vg 2570 is applied with a negative voltage of −8 volts, the drain voltage Vd 2574 is applied with 8 volts, the source voltage Vs 2576 is applied with 8 volts, and the substrate voltage Vsub 2572 is applied with 8 volts. The combination of these applied voltages causes hole injection erase by hole tunneling in moving hole charges through the p-type substrate 2510, the bottom dielectric layer 2530, and into the charge trapping layer 2540.

FIG. 29A is a structural diagram illustrating the programming of the left bit in the M(HK)NOS memory 2500 or the M(HK)NOS TFT memory 2600, and FIG. 29B is a corresponding graphical diagram of a two-bit-per-cell operation window that illustrates the second bit effect which pertains to the right bit in this instance. A second bit effect occurs in a memory cell that employs a two-bit operation, i.e. a left bit and right bit. When one of the two bits is programmed, the voltage threshold for the other bit may also increase, even though only one bit is programmed. The programming of a left bit is illustrated in FIG. 29A with an indication of charges 2910 on a left bit 2912. Although only the left bit 2912 is programmed, the programming of the left bit 2912 also causes the voltage threshold of a right bit 2914 to increase, as shown in FIG. 29B. A curve 2920 illustrates that the voltage threshold of right bit 2914 increases as the left bit 2912 is programmed. Such phenomenon is referred to as a second bit effect. An ideal curve, without the second bit effect, would include continuing programming of a left bit which would cause the voltage threshold of the left bit to increase but the voltage threshold of the right bit would not be affected such that the voltage threshold of the right bit would remain substantially constant.

Figure 30:
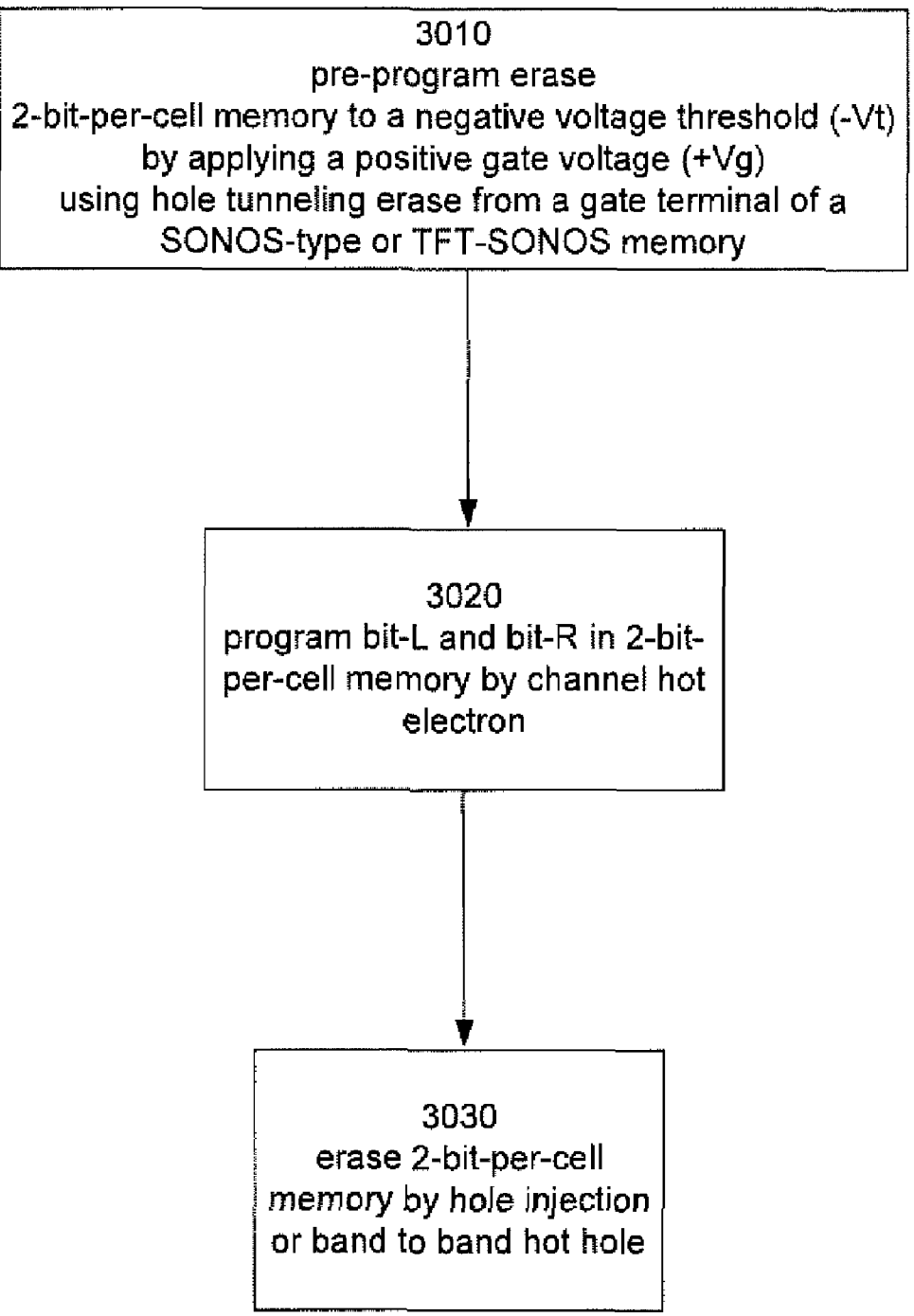
FIG. 30 is a flow diagram illustrating the process to pre-program erase SONOS-type or TFT-SONOS memories by applying a positive gate voltage in accordance with the present invention.

In addition to the erase operations described above with respect to various embodiments, the present invention can also be applied as a pre-program erase step as described in the following flow diagrams. FIG. 30 is a flow diagram illustrating the process 3000 to pre-program erase SONOS-type or TFT-SONOS memories. At step 3010, a memory structure comprising a SONOS-type or TFT-SONOS memory having two-bits-per-cell is pre-program erased to a negative voltage threshold, −Vt, by applying a positive gate voltage, +Vg, using hole tunneling erase from a gate terminal of a SONOS-type or TFT-SONOS memory. At step 3020, the SONOS-type or TFT-SONOS memory is programmed by channel hot electron to a left bit and a right bit of the charge trapping memory. At step 3030, the SONOS-type or TFT-SONOS memory is erased either by a hole injection technique or a band-to-band hot hole technique. Alternatively at step 3010, in some embodiments, the pre-program erase is implemented using a band-to-band hot hole erase instead of the hole tunneling technique. In other embodiments at step 3010, the hole tunneling technique in the pre-program erase operation erases the SONOS-type or TFT-SONOS memory to a voltage level that is lower than an initial voltage threshold, Vt(i).

Figure 31:
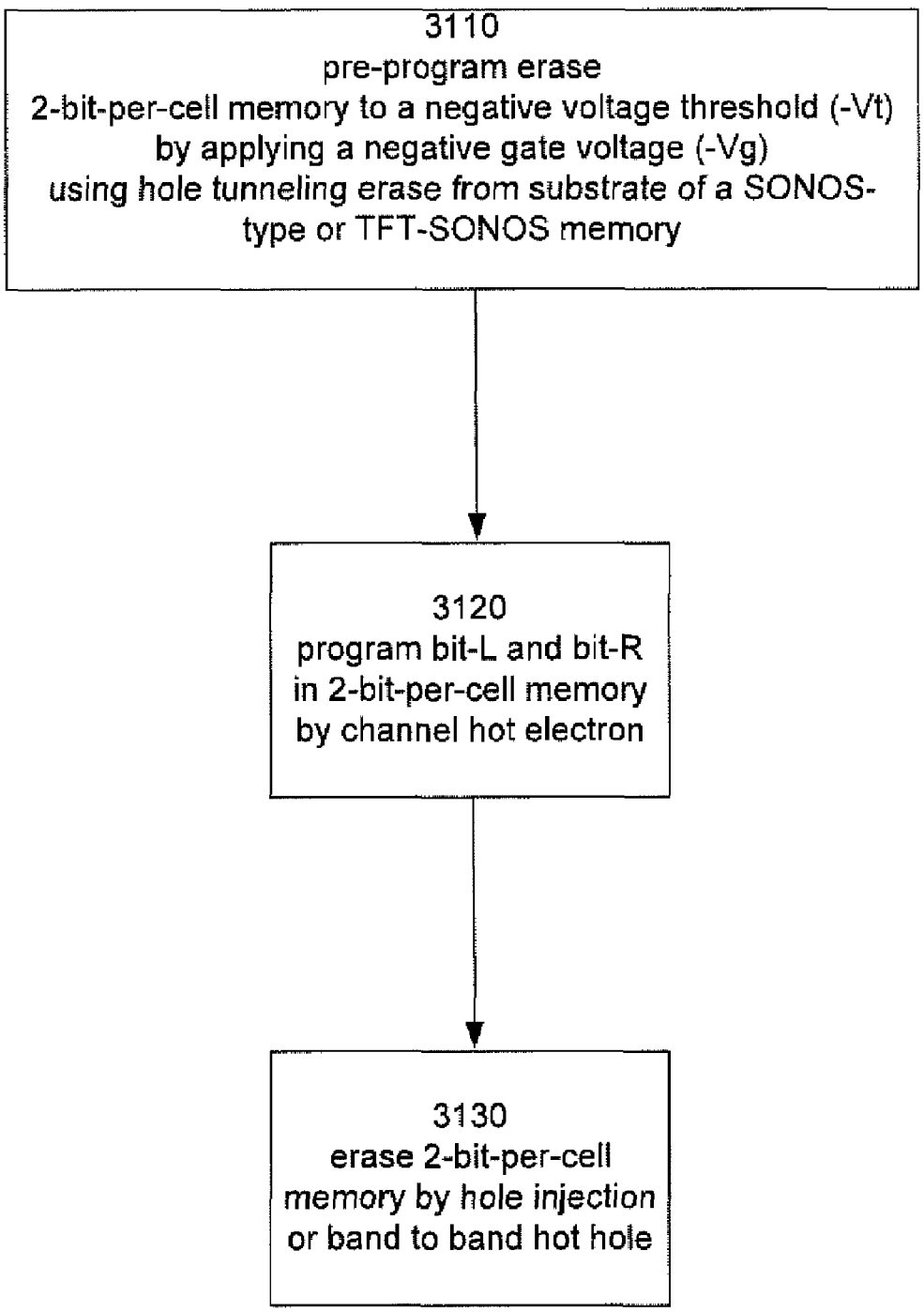
FIG. 31 is a flow diagram illustrating the process to pre-program erase SONOS-type or TFT-SONOS memories by applying a negative gate voltage in accordance with the present invention.

FIG. 31 is a flow diagram illustrating the process 3100 of pre-program erasing of SONOS-type or TFT-SONOS memories. At step 3110, a memory structure comprising a SONOS-type or TFT-SONOS memory having two-bits-per-cell is pre-program erased to a negative voltage threshold, −Vt, by applying a positive gate voltage, −Vg, using hole tunneling erase from a gate terminal of a SONOS-type or TFT-SONOS memory. At step 3120, the SONOS-type or TFT-SONOS memory is programmed by channel hot electron to a left bit and a right bit of the memory cell. At step 3130, the SONOS-type or TFT-SONOS memory is erased either by a hole injection technique or a band-to-band hot hole technique. Alternatively at step 3110 in some embodiments, the pre-program erase is implemented using a band-to-band hot hole erase instead of the hole tunneling technique. In other embodiments at step 3110, the hole tunneling technique in the pre-program erase erases the SONOS-type or TFT-SONOS memory to a voltage level that is lower than an initial voltage threshold, Vt(i).

Figure 32:
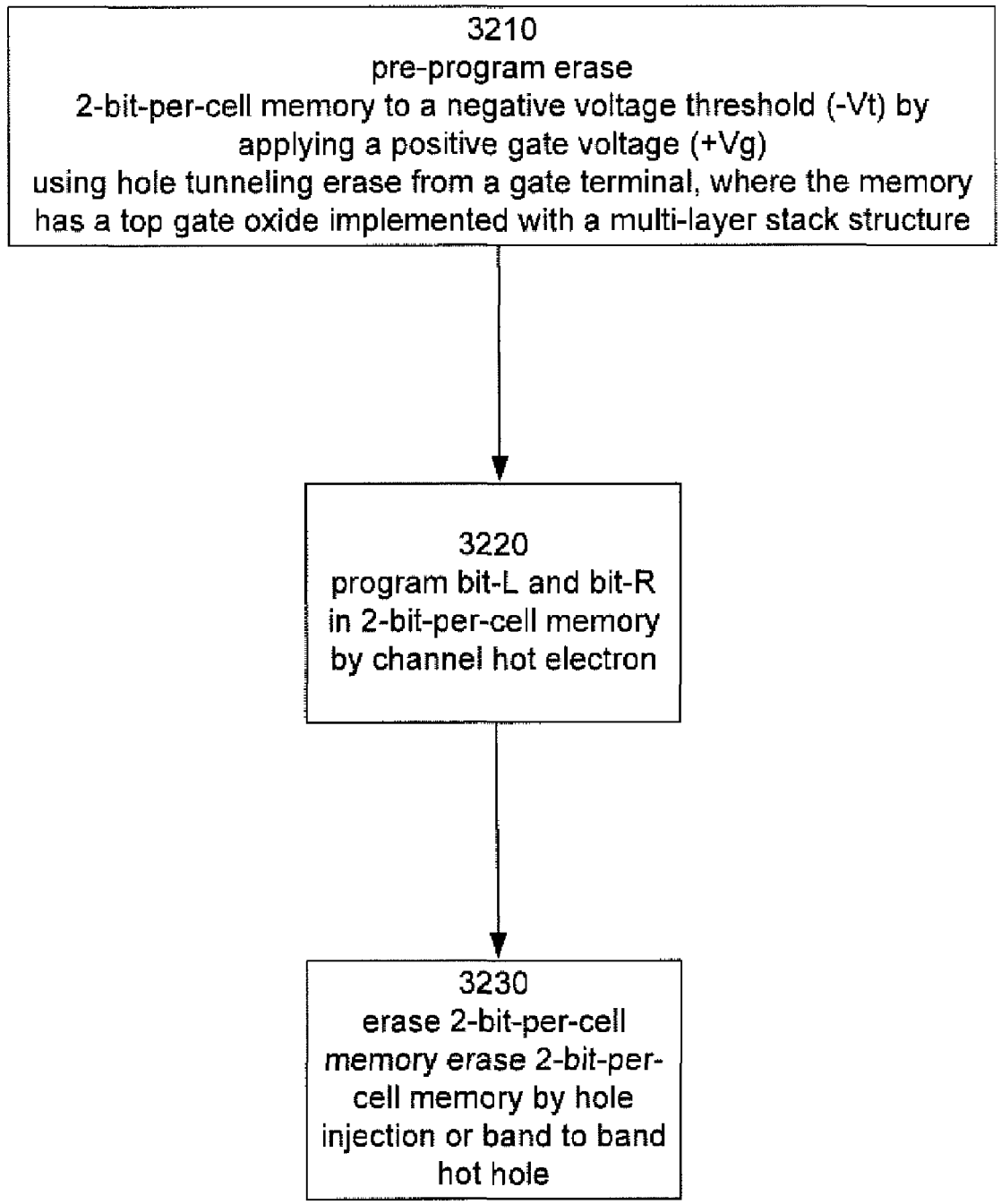
FIG. 32 is a flow diagram illustrating the process to pre-program erase a SONOS-type or TFT-SONOS memory having a top oxide structure in accordance with the present invention.

FIG. 32 is a flow diagram illustrating the process 3200 of pre-program erasing a SONOS-type or TFT-SONOS memory comprising a top gate oxide having a multi-layer stack where each memory cell has two bits per cell. At step 3210, the SONOS-type or TFT-SONOS memory structure with the multi-layer stack is erased to a negative voltage threshold, −Vt, by applying a positive gate voltage, +Vg, using hole tunneling erase from a gate terminal of a SONOS-type or TFT-SONOS memory. At step 3220, the SONOS-type or TFT-SONOS memory is programmed by channel hot electron to a left bit and a right bit of the memory cell. At step 3230, the SONOS-type or TFT-SONOS memory is erased either by a hole injection technique or a band-to-band hot hole technique. Alternatively at step 3210 in some embodiments, the pre-program erase is implemented using a band-to-band hot hole erase instead of the hole tunneling technique. In other embodiments at step 3210, the hole tunneling technique in the pre-program erase erases the SONOS-type or TFT-SONOS memory to a voltage level that is lower than an initial voltage threshold, Vt(i). In a further embodiment at step 3210, the SONOS-type or TFT-SONOS memory structure with the multi-layer stack is erased to a negative voltage threshold, −Vt, by applying a negative gate voltage, −Vg, using hole tunneling erase from substrate of the SONOS-type or TFT-SONOS memory.

Figure 33:
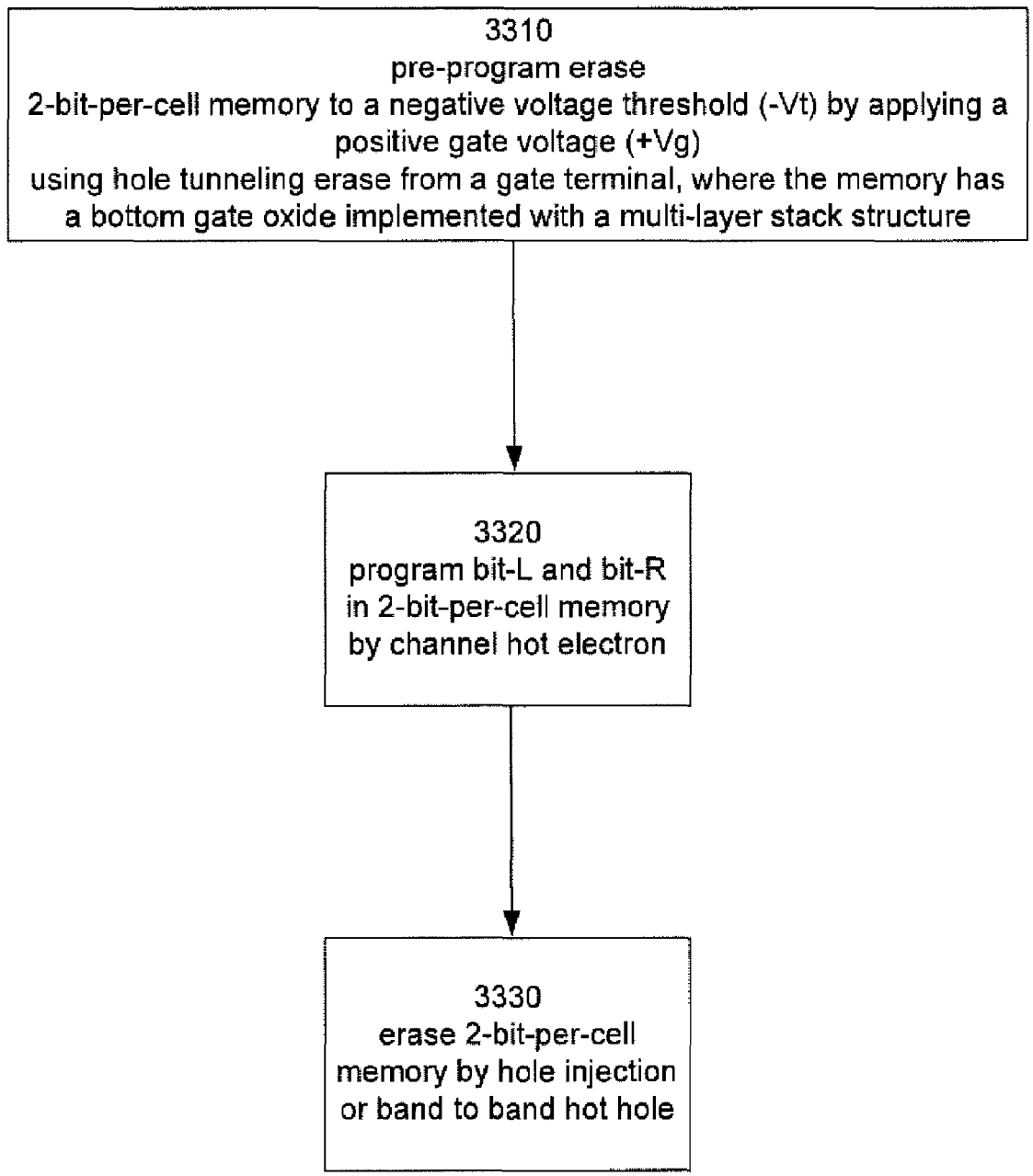
FIG. 33 is a flow diagram illustrating the process to pre-program erase a SONOS-type or TFT-SONOS memory having a bottom oxide structure in accordance with the present invention.

FIG. 33 is a flow diagram illustrating the process 3300 of pre-program erasing a SONOS-type or TFT-SONOS memory comprising a bottom gate oxide having a multi-layer stack where each memory cell has two bits per cell. At step 3310, the SONOS-type or TFT-SONOS memory structure with the multi-layer stack is erased to a negative voltage threshold, −Vt, by applying a positive gate voltage, +Vg, using hole tunneling erase from a gate terminal of a SONOS-type or TFT-SONOS memory. At step 3320, the SONOS-type or TFT-SONOS memory is programmed by channel hot electron to a left bit and a right bit of the memory cell. At step 3330, the SONOS-type or TFT-SONOS memory is erased either by a hole injection technique or a band-to-band hot hole technique. Alternatively at step 3310 in some embodiments, the pre-program erase is implemented using a band-to-band hot hole erase instead of the hole tunneling technique. In other embodiments at step 3310, the hole tunneling technique in the pre-program erase erases the SONOS-type or TFT-SONOS memory to a voltage level that is lower than an initial voltage threshold, Vt(i). In a further embodiment at step 3310, the SONOS-type or TFT-SONOS memory structure with the multi-layer stack is erased to a negative voltage threshold, −Vt, by applying a negative gate voltage, −Vg, using hole tunneling erase from the substrate of the SONOS-type or TFT-SONOS memory.

Figure 34:
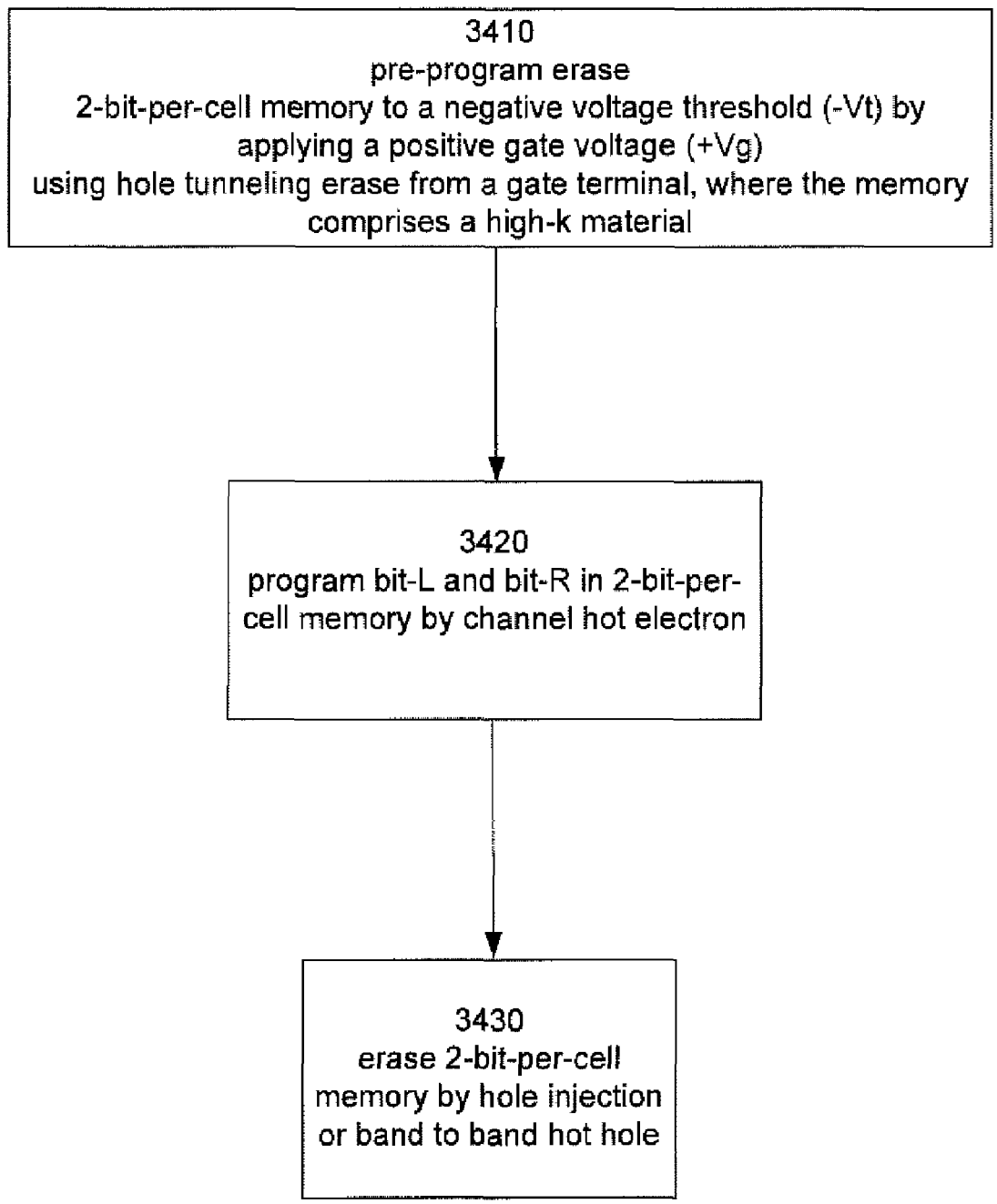
FIG. 34 is a flow diagram illustrating the process to pre-program erase a SONOS-type or TFT-SONOS memory comprising a high-K material in accordance with the present invention.

FIG. 34 is a flow diagram illustrates the process 3400 of pre-program erasing a SONOS-type or TFT-SONOS memory comprising a high-K material where each memory cell has two bits per cell. At step 3410, the SONOS-type or TFT-SONOS memory structure with the high-k material is erased to a negative voltage threshold, −Vt, by applying a positive gate voltage, +Vg, using hole tunneling erase from a gate terminal of a SONOS-type or TFT-SONOS memory. At step 3420, the SONOS-type or TFT-SONOS memory is programmed by channel hot electron to a left bit and a right bit of the memory cell. At step 3430, the SONOS-type or TFT-SONOS memory is erased either by a hole injection technique or a band-to-band hot hole technique. Alternatively at step 3410 in some embodiments, the pre-program erase is implemented using a band-to-band hot hole erase instead of the hole tunneling technique. In other embodiments at step 3410, the hole tunneling technique in the pre-program erase erases the SONOS-type or TFT-SONOS memory to a voltage level that is lower than an initial voltage threshold, Vt(i). In a further embodiment at step 3410, the SONOS-type or TFT-SONOS memory structure with the multi-layer stack is erased to a negative voltage threshold, −Vt, by applying a negative gate voltage, −Vg, using hole tunneling erase from substrate of the SONOS-type or TFT-SONOS memory.

The invention has been described with reference to specific exemplary embodiments. For example, the method in the present invention is applicable to any type or variation of a nitride trapping memory including both N-channel and P-channel SONOS types of devices and floating gate memory. Various modifications, adaptations, and changes may be made without departing from the spirit and scope of the invention.

Accordingly, the specification and drawings are to be regarded as illustrative of the principles of this invention rather than restrictive, the invention is defined by the following appended claims.

I claim:

1. A memory device for increasing a memory operation window, the memory device having a left charge storage site for storing at least a first bit and a right charge storage site for storing at least a second bit in which sufficient charge is trapped in the left charge storage site to establish a negative threshold voltage, comprising:
    a channel region disposed between a drain region and a source region;
    a charge trapping structure overlying the channel region; and
    a conductive layer overlying the charge trapping structure;
    a bias condition applied to the memory device that causes electron injection to the right charge storage site while the left charge storage site traps sufficient charge to establish the negative threshold voltage.

2. The memory device of claim 1, wherein the charge trapping structure comprises a silicon nitride layer overlying a dielectric layer.

3. The memory device of claim 1, wherein the charge trapping structure comprises a top dielectric layer overlying a silicon nitride layer; and a silicon nitride layer overlying a bottom dielectric layer.

4. The memory device of claim 1, wherein the channel region comprises epitaxial silicon.

5. The memory device of claim 1, wherein the channel region comprises a poly silicon.

6. The memory device of claim 1, wherein the channel region has a thickness of about 500Å to about 1000 Å.

7. The memory device of claim 1, wherein said bias condition induces channel hot electron programming of said right charge storage site.

8. A memory device for increasing a memory operation window, the memory device having a left charge storage site for storing at least a first bit and a right charge storage site for storing at least a second bit in which sufficient charge is trapped in the left charge storage site to establish a threshold voltage level lower than an initial voltage threshold level, comprising:
    a channel region disposed between a drain region and a source region;
    a charge trapping structure overlying the channel region; and
    a conductive layer overlying the charge trapping structure;
    a bias condition applied to the memory device that causes electron injection to the right charge storage site while the left charge storage site traps sufficient charge to establish the threshold voltage level lower than an initial voltage threshold level.

9. The memory device of claim 8, wherein the charge trapping structure comprises a Silicon nitride layer overlying a dielectric layer.

10. The memory device of claim 8, wherein the charge trapping structure comprises a top dielectric layer overlying a silicon nitride layer; and a silicon nitride layer overlying a bottom dielectric layer.

11. The memory device of claim 8, wherein the channel region comprises epitaxial silicon.

12. The memory device of claim 8, wherein the channel region comprises a poly silicon.

13. The memory device of claim 8, wherein the channel region has a thickness of about 500Å to about 1000Å.

14. The memory device of claim 8, wherein said bias condition induces channel hot electron programming of said right charge storage site.

* * * * *